US007117420B1

(12) United States Patent
Yeung et al.

(10) Patent No.: US 7,117,420 B1
(45) Date of Patent: Oct. 3, 2006

(54) CONSTRUCTION OF AN OPTIMIZED SEC-DED CODE AND LOGIC FOR SOFT ERRORS IN SEMICONDUCTOR MEMORIES

(75) Inventors: Max M. Yeung, San Jose, CA (US); Richard J. Stephani, St. Paul, MN (US); Miguel A. Vilchis, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 301 days.

(21) Appl. No.: 09/975,293

(22) Filed: Oct. 11, 2001

Related U.S. Application Data

(60) Provisional application No. 60/292,227, filed on May 17, 2001.

(51) Int. Cl.
*H03M 13/00* (2006.01)
*G11C 29/00* (2006.01)

(52) U.S. Cl. .................................. 714/763; 714/773
(58) Field of Classification Search ................ 714/763, 714/773, 781, 785
See application file for complete search history.

(56) References Cited

U.S. PATENT DOCUMENTS

| | | | | |
|---|---|---|---|---|
| 3,623,155 A | * | 11/1971 | Hsiao et al. ................ 714/785 |
| 4,464,753 A | * | 8/1984 | Chen .......................... 714/765 |
| 4,486,882 A | * | 12/1984 | Piret et al. .................. 714/788 |
| 4,726,021 A | * | 2/1988 | Horiguchi et al. .......... 714/773 |
| 4,730,320 A | * | 3/1988 | Hidaka et al. .............. 714/766 |
| 4,736,376 A | * | 4/1988 | Stiffler ........................ 714/785 |
| 5,233,614 A | * | 8/1993 | Singh .......................... 714/723 |
| 5,535,227 A | | 7/1996 | Silvano ...................... 371/40.4 |
| 5,600,659 A | | 2/1997 | Chen .......................... 371/37.1 |
| 5,719,887 A | | 2/1998 | Kazuno ...................... 371/40.1 |
| 5,841,795 A | | 11/1998 | Olarig et al. ............. 371/40.13 |
| 5,856,987 A | | 1/1999 | Holman ................... 371/37.01 |
| 5,922,080 A | | 7/1999 | Olarig ........................ 714/767 |
| 6,233,717 B1 | | 5/2001 | Choi .......................... 714/805 |
| 2002/0041647 A1 | * | 4/2002 | Lin et al. .................... 375/354 |

OTHER PUBLICATIONS

Stephen B. Wicker, Error Control for Digital Communication and Storage, Prentice-Hall 1995; pp.99-121.*
Hsiao, M.Y., "A Class of Optimal Minimum Odd-weight-column SEC_DED Codes", *IBM Journal of Research and Development*, vol. 14, No. 4, Jul. 1970, pp. 394-401.
Book: Siewiorek, Daniel P., and Swarz, Robert S., *Reliable Computer Systems Design and Evaluation*, Third Ed., AK Peters, 1998, pp. 771-777.
Book: Adamek, Jiri, *Foundation of Coding: Theory and Applications of Error-Correcting Codes*, John Wiley & Sons, Inc., 1991, pp. 48-51, 63-75, and 114-125.

* cited by examiner

*Primary Examiner*—Joseph Torres
(74) *Attorney, Agent, or Firm*—Christopher P. Maiorana, P.C.

(57) ABSTRACT

An apparatus for memory error control coding comprising a first circuit and a second circuit. The first circuit may be configured to generate a multi-bit digital syndrome signal in response to a read data signal and a read parity signal. The second circuit may be configured to (i) detect an error when the bits of the syndrome signal are not all the same state and (ii) generate an error location signal in response the syndrome signal. The error location signal may be generated in response to fewer than all of the bits of the syndrome signal.

20 Claims, 7 Drawing Sheets

CONSTRUCTION OF AN OPTIMIZED SEC-DED CODE AND LOGIC FOR SOFT ERRORS IN SEMICONDUCTOR MEMORIES

This application claims the benefit of U.S. Provisional Application No. 60/292,227, filed May 17, 2001 which is hereby incorporated by reference in its entirety.

FIELD OF THE INVENTION

The present invention relates to a method and/or architecture for error control coding in semiconductor memory applications generally and, more particularly, to a method and/or architecture for construction of an optimized SEC-DED code and logic for error detection and correction in semiconductor memories.

BACKGROUND OF THE INVENTION

Semiconductor memories can experience high failure rates due to "soft" errors (i.e., errors where data in a memory array change prior to or during a given memory access and whose original value can be restored upon rewriting of the data). Causes of soft errors include primarily ionizing radiation effects induced by neutron and alpha particle bombardment and to a much lesser extent due to loss of cell charge, electronic noise, stray radiation, and poor connections. Conventional solutions to reduce the failure rate of semiconductor memories due to soft errors include (i) error control coding (ECC), (ii) materials selection, and (iii) changes to process, bit-cell design and/or circuit design. ECC can include conventional single error correcting and double error detecting (SEC-DED) code implementations.

However, conventional solutions have failed to eliminate semiconductor memory soft errors. Furthermore, existing SEC-DED code implementations are not optimized for (i) minimum circuit area and logic gate count, and/or (ii) maximum performance and reliability.

It would be desirable to have a method and/or architecture for error control coding in semiconductor memory that (i) reduces soft errors, (ii) minimizes circuit area, (iii) optimizes logic gate count, (iv) increases performance, and/or (v) increases reliability.

SUMMARY OF THE INVENTION

The present invention concerns an apparatus for memory error control coding comprising a first circuit and a second circuit. The first circuit may be configured to generate a multi-bit digital syndrome signal in response to a read data signal and a read parity signal. The second circuit may be configured to (i) detect an error when the bits of the syndrome signal are not all the same state and (ii) generate an error location signal in response the syndrome signal. The error location signal may be generated in response to fewer than all of the bits of the syndrome signal.

The objects, features and advantages of the present invention include providing a method and/or architecture for construction of an optimized single error correcting and double error detecting (SEC-DED) code and logic for error control coding (ECC) in semiconductor memory that may (i) reduce soft errors, (ii) minimize circuit area, (iii) minimize logic gate count, (iv), maximize performance, (v) maximize reliability, (vi) bypass error location detection and correction circuitry when no errors are detected, (vii) optimize parity encoder design, (viii) optimize inverted syndrome encoder design, (ix) optimize error locator design and/or, (x) optimize inverted syndrome error detector design with and without multiple single errors.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
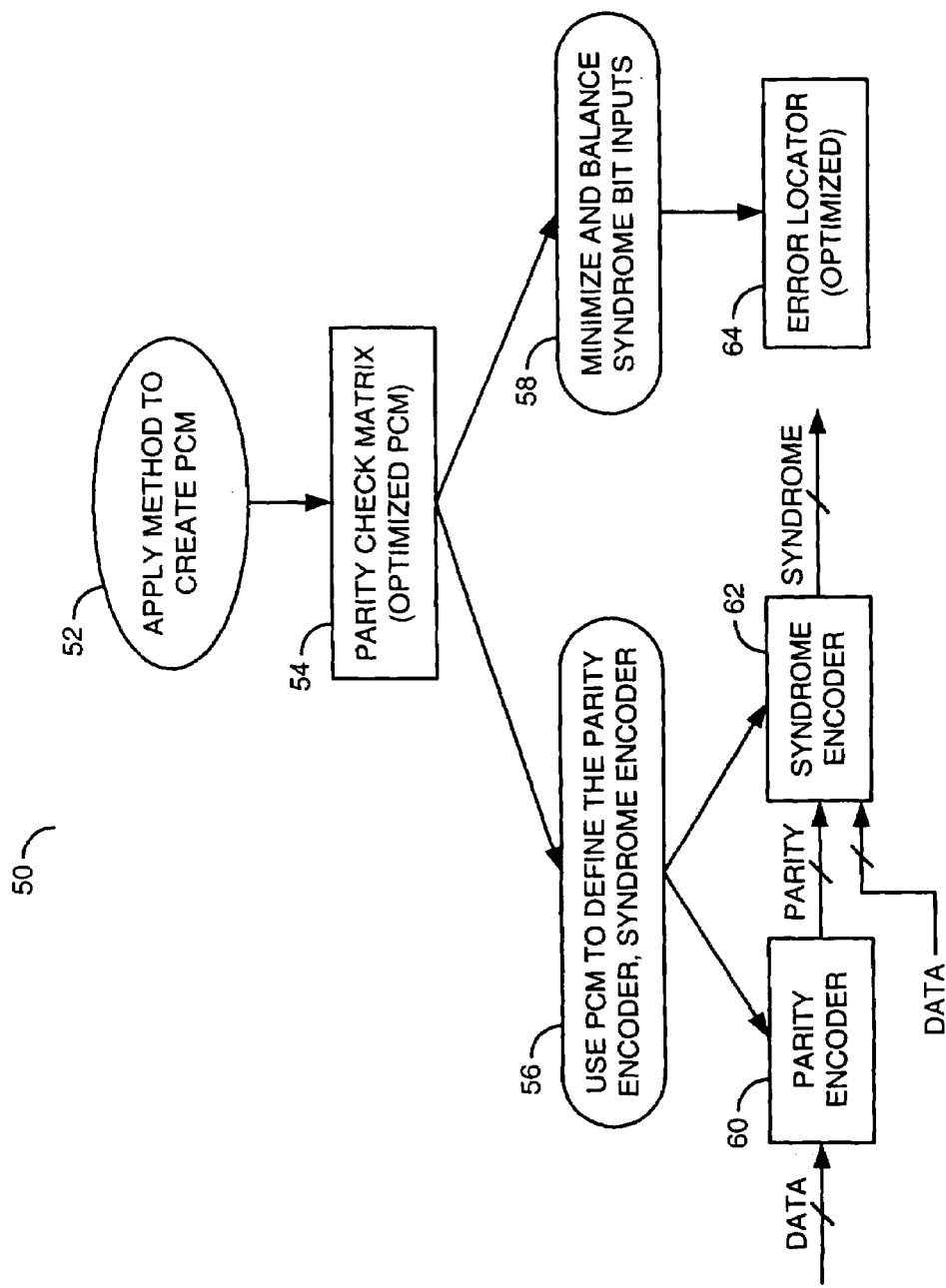
FIG. 1 is a flow chart illustrating a logic generation process in accordance with a preferred embodiment of the present invention.

Referring to FIG. 1, a flow diagram 50 illustrating a logic generation process for a semiconductor memory read and write circuit is shown in accordance with a preferred embodiment of the present invention. The process 50 may be used to generate a single error correcting and double error detecting (SEC-DED) error control coding (ECC) and logic that may be optimized for soft errors in the semiconductor memory. The process 50 generally comprises steps that define a parity check matrix 54, a parity encoder 60, a syndrome encoder 62, and an error locator 64. The process 50 may be implemented in any appropriate semiconductor memory (e.g., SRAM, etc.).

The process 50 may have the following steps:

Step 1: A parity check matrix (PCM) method may be used to generate the PCM 54 (e.g., block 52). The PCM 54 is generally represented as rows and columns of 1's (e.g., digital HIGH or on) and 0's (e.g., digital LOW or off).

Step 2: The PCM 54 may be optimized using corollaries of the PCM generation method (e.g., block 54).

Step 3: The parity encoder 60 and the syndrome encoder 62 may be defined using the optimized PCM 54 (e.g., block 56).

Step 4: The syndrome encoder 62 signals presented to the error locator 64 may be minimized and balanced and the error locator 64 may be optimized (e.g., block 58).

The parity encoder 60 logic and syndrome encoder 62 logic may be defined by the location of 1's in the PCM 54. The connectivity and logic of the error locator 64 may be derived from the PCM 54. The process 50 may (i) optimize the connectivity to and (ii) minimize the required logic for the error locator 64.

The process 50 to generate the PCM 54 may be stated as follows:

(A) The parity check matrix (PCM) 54 may comprise an (n, k) linear code (e.g., PARITY).

(B) For each of the PCM 54 code vectors PARITY of Hamming weight d, there may be d columns of the PCM 54 such that the vector sum of the d columns is equal to the zero vector.

(C) Conversely, when d columns of the PCM 54 have a vector sum equal to the zero vector, there may be a code vector of Hamming weight d in the code PARITY.

Two corollaries generally follow from the process 50:

Corollary 1: When no (d−1) or fewer columns of the PCM 54 add to 0, the code PARITY generally has a minimum weight of at least d.

Corollary 2: The minimum weight of the code PARITY is generally equal to the smallest number of columns of the PCM 54 that have a sum equal to 0.

A linear SEC-DED code may be generated by following guidelines based on the above two corollaries:

Guideline 1: The minimum weight for an SEC-DED code is generally d=4.

Guideline 2: Any three or fewer columns of the PCM 54 may be linearly independent for the Corollary 1 to be met.

The PCM 54 generally meets the following parameters:

Parameter 1: The PCM 54 may have one or more non-zero columns.

Parameter 2: Each column of the PCM 54 is generally distinct.

Parameter 3: The sum of three or fewer columns of the PCM 54 may be nonzero.

Parameter 4: In order that the sum of three or fewer columns of the PCM 54 is nonzero, every column may contain an odd number of 1's, (e.g., every column may have an odd weight).

Parameter 5: To minimize the overall ECC logic gate count, the total number of 1's in the PCM 54 may be a minimum.

Parameter 6: To balance the syndrome encoder 62, the number of 1's in each row of the PCM 54 may be equal to or as close as possible to the average number of 1's in all of the rows in the PCM 54.

The PCM 54 may be generated using the following guidelines based on the above method and corollaries:

Guideline 1: For an (n,k) linear code, the first k-columns in the PCM 54 may be designated to contain data and each column may be odd-weighted.

Guideline 2: The last (n-k) parity check columns in the PCM 54 may be the identity matrix.

Guideline 3: Combinatorial analysis may be used to generate the k-odd-weight columns of the PCM 54 such that a minimum number of 1's are implemented and the number of 1's per row is balanced.

When the PCM 54 has been generated and optimized in accordance with the guidelines (1) through (3), the parity encoder 60 and syndrome encoder 62 logic may be defined. When the structure of the PCM 54 is optimized, the logic implemented for the parity encoder 60 and syndrome encoder 62 may be optimized for minimum gate count, connectivity and latency.

In one example, the process 50 may be implemented to generate the PCM 54, the parity encoder 60, the syndrome encoder 62 and the error locator 64 for a memory signal (e.g., DATA). The signal DATA may be implemented as a k-bit digital signal, where k is an integer. In one example, the integer k may equal 128. The signal DATA may be a 128-bit data signal (e.g., DATA[0]–DATA[127]). However, other values of k may be implemented accordingly to meet the design criteria of a particular application.

The parity encoder 60 may generate the coded parity signal PARITY. The signal PARITY may be implemented as an r-bit digital signal, where r is an integer. The signal PARITY may be, in one example, a 9-bit signal (e.g., PARITY[0]-PARITY[8]). However, other values of r may be implemented accordingly to meet the design criteria of a particular application. In one example, the bits of the signal PARITY of the PCM 54 may be implemented for the respective bits of the signal DATA as a (137, 128) code as follows:

| PCM 54 | |
|---|---|
| DATA | PARITY |
| 0 | 111000000 |
| 1 | 110100000 |
| 2 | 110010000 |
| 3 | 110001000 |
| 4 | 110000100 |
| 5 | 110000010 |
| 6 | 110000001 |
| 7 | 101100000 |
| 8 | 101010000 |
| 9 | 101001000 |
| 10 | 101000100 |
| 11 | 101000010 |
| 12 | 101000001 |
| 13 | 100110000 |
| 14 | 100101000 |
| 15 | 100100100 |
| 16 | 100100010 |
| 17 | 100100001 |
| 18 | 100011000 |
| 19 | 100010100 |
| 20 | 100010010 |
| 21 | 100010001 |
| 22 | 100001100 |
| 23 | 100001010 |
| 24 | 100001001 |
| 25 | 100000110 |
| 26 | 100000101 |
| 27 | 100000011 |
| 28 | 011100000 |
| 29 | 011010000 |
| 30 | 011001000 |
| 31 | 011000100 |
| 32 | 011000010 |
| 33 | 011000001 |
| 34 | 010110000 |
| 35 | 010101000 |
| 36 | 010100100 |
| 37 | 010100010 |
| 38 | 010100001 |
| 39 | 010011000 |
| 40 | 010010100 |
| 41 | 010010010 |
| 42 | 010010001 |
| 43 | 010001100 |
| 44 | 010001010 |
| 45 | 010001001 |
| 46 | 010000110 |
| 47 | 010000101 |
| 48 | 010000011 |
| 49 | 001110000 |
| 50 | 001101000 |
| 51 | 001100100 |
| 52 | 001100010 |
| 53 | 001100001 |
| 54 | 001011000 |
| 55 | 001010100 |
| 56 | 001010010 |
| 57 | 001010001 |
| 58 | 001001100 |
| 59 | 001001010 |
| 60 | 001001001 |
| 61 | 001000110 |
| 62 | 001000101 |
| 63 | 001000011 |
| 64 | 000111000 |

-continued

PCM 54

| DATA | PARITY |
|---|---|
| 65 | 000110100 |
| 66 | 000110010 |
| 67 | 000110001 |
| 68 | 000101100 |
| 69 | 000101010 |
| 70 | 000101001 |
| 71 | 000100110 |
| 72 | 000100101 |
| 73 | 000100011 |
| 74 | 000011100 |
| 75 | 000011010 |
| 76 | 000011001 |
| 77 | 000010110 |
| 78 | 000010101 |
| 79 | 000010011 |
| 80 | 000001110 |
| 81 | 000001101 |
| 82 | 000001011 |
| 83 | 000000111 |
| 84 | 111110000 |
| 85 | 110111000 |
| 86 | 111011000 |
| 87 | 110101100 |
| 88 | 110000111 |
| 89 | 101111000 |
| 90 | 101011100 |
| 91 | 111101000 |
| 92 | 101000111 |
| 93 | 100111100 |
| 94 | 100111010 |
| 95 | 100100111 |
| 96 | 100011110 |
| 97 | 100010111 |
| 98 | 100001111 |
| 99 | 011111000 |
| 100 | 011011100 |
| 101 | 011101100 |
| 102 | 011000111 |
| 103 | 011100011 |
| 104 | 010111100 |
| 105 | 010100111 |
| 106 | 110100011 |
| 107 | 110110100 |
| 108 | 010011110 |
| 109 | 010010111 |
| 110 | 110010011 |
| 111 | 010001111 |
| 112 | 110001011 |
| 113 | 001111100 |
| 114 | 001101110 |
| 115 | 001100111 |
| 116 | 001111001 |
| 117 | 111100001 |
| 118 | 001011110 |
| 119 | 001010111 |
| 120 | 101010011 |
| 121 | 111010001 |
| 122 | 011011011 |
| 123 | 101001011 |
| 124 | 011101001 |
| 125 | 000111101 |
| 126 | 000110111 |
| 127 | 101100011 |

However, other appropriate values for the signal PARITY may be implemented accordingly to meet the design criteria of a particular application.

The syndrome encoder 62 may be configured to generate a syndrome signal (e.g., SYNDROME). The signal SYNDROME may be implemented as an s-bit digital signal, where s is an integer. In one example, the signal SYNDROME may be a 9-bit signal (e.g., SYNDROME[0]-SYNDROME[8]). However, other values of s may be implemented accordingly to meet the design criteria of a particular application.

When the process 50 is implemented, eight alternatives of the parity encoder 60 may be implemented. A comparison of eight alternative embodiments of the parity encoder 60 synthesized using nominal values for the components and operating conditions may be summarized in the following TABLE 1:

TABLE 1

| Encoder 60 Type | Resulting Parity bits | Delay of Synthesized circuit | Number of Cells | Area of Synthesized Circuit (logic units) |
|---|---|---|---|---|
| Non-Inverting XOR | Non-Inverted | 1.77 ns | 262 | 3427.00 |
| Non-Inverting XOR with output Inverted by NOT | Inverted | 1.38 ns | 257 | 3427.00 |
| Inverting XOR | Inverted | 1.38 ns | 257 | 3427.00 |
| Inverting XOR with output Inverted by NOT | Non-Inverted | 1.42 ns | 263 | 3453.00 |
| Non-Inverting XNOR | Non-Inverted | 1.44 ns | 331 | 3314.00 |
| Inverting XNOR | Inverted | 1.07 ns | 322 | 3320.00 |
| Non-Inverting XNOR with out-put Inverted by NOT | Inverted | 1.43 ns | 329 | 3321.00 |
| Inverting XNOR with output Inverted by NOT | Non-Inverted | 1.01 ns | 330 | 3317.00 |

The non-inverting XOR type of the parity encoder 60 is a conventional parity encoder and has the longest nominal delay (e.g., 1.77 ns). The other seven alternative designs for the parity encoder 60 may comprise aspects of the present invention. The alternative 8 of the parity encoder 60 may have the shortest nominal delay (e.g., 1.01 ns).

In a first embodiment, the parity encoder 60 may be implemented as a non-inverting parity encoder using exclusive-OR (e.g., XOR) gates (e.g., alternative 1 in TABLE 1). The non-inverting parity encoder 60 generally presents the parity bits PARITY[0]–PARITY[8] that are the logical combinations of the data bits DATA[0]–DATA[127] generated using XOR logic gates. Each row of the PCM 54 may define the given parity bits PARITY[0]-PARITY[8] generated and the data bits DATA[0]–DATA[127] to be combined to generate the given parity bits PARITY[0]-PARITY[8]. For example, on row 1 of the PCM 54, the parity bit PARITY[0] may be selected as the output. The parity bit PARITY[0] generally corresponds to an ECC parity bit 0. The parity bit PARITY[0] may be equal to an XOR combination of the data bits DATA[0]–DATA[27], DATA[84]–DATA[98], DATA[106], DATA[107], DATA[110], DATA[112], DATA[117], DATA[120], DATA[121], DATA[123], and DATA[127]. The parity bits PARITY[1]-PARITY[8] may be generated similarly to the parity bit PARITY[0].

In a second embodiment, the parity encoder 60 may be implemented as a non-inverting parity encoder using XOR gates with an output inverted by NOT gates (e.g., alternative 2 in TABLE 1). The second embodiment may be implemented similarly to the first embodiment described above. However, in one example, a NOT logic gate (e.g., an inverter) may be implemented on each parity output of a parity encoder 60 to generate the inverted parity bits PARITY[0]-PARITY[8]. However, any suitable inverting logic and/or circuitry may be implemented accordingly to meet the design criteria of a particular application.

In a third embodiment, the parity encoder 60 may be implemented as an inverting parity encoder using XOR gates (e.g., alternative 3 in TABLE 1). Each parity bit PARITY[0]-PARITY[8] may be a logical combination of data bits (e.g., DATA[0]–DATA[127]) defined by the PCM 54 and the logic value 1. Any value combined with logic 1 using an XOR gate will generally result in the digital complement (e.g., opposite) of the value. For example, on row 1 of the PCM 54, the parity bit PARITY[0] may be presented as the output. The parity bit PARITY[0] may be equal to the XOR combination of the data bits DATA[0]–DATA[27], DATA[84]–DATA[98], DATA[106], DATA[107], DATA[110], DATA[112], DATA[117], DATA[120], DATA[121], DATA[123], DATA[127] and the logic 1. The parity bits PARITY[1]-PARITY[8] may be generated similarly to the parity bit PARITY[0].

In a fourth embodiment, the parity encoder 60 may be implemented as an inverting parity encoder using XOR gates with an output inverted by NOT gates (e.g., alternative 4 in TABLE 1). The fourth embodiment may be implemented similarly to the third embodiment described above. However, in one example, a NOT logic gate (e.g., an inverter) may be implemented on each parity output of a parity encoder 60 to generate the inverted parity bits PARITY[0]-PARITY[8]. However, any suitable inverting logic and/or circuitry may be implemented accordingly to meet the design criteria of a particular application.

In a fifth embodiment, the parity encoder 60 may be implemented as a non-inverting parity encoder using exclusive-NOR (e.g., XNOR) gates (e.g., alternative 5 in TABLE 1). Each parity bit PARITY[0]-PARITY[8] may be a logical combination of the data bits DATA[0]–DATA[127] defined by the PCM 54 and the logic value 0. The fifth embodiment of the parity encoder 60 may implement the following two rules to generate the non-inverted parity bits PARITY[0]-PARITY[8]:

Rule 1: When an odd number of the data bits DATA[0]–DATA[127] are presented to the parity encoder 60, XNOR logic may be implemented to combine all of the data bits DATA[0]–DATA[127] that are presented to generate the respective parity bit PARITY[0]-PARITY[8]; and/or Rule 2: When an even number of the data bits DATA[0]–DATA[127] are presented to the parity encoder 60, XNOR logic may be implemented to combine all of the bits DATA[0]–DATA[127] that are presented and a logic 0 together to generate the respective parity bit PARITY[0]-PARITY[8].

In a sixth embodiment, the parity encoder 60 may be implemented as an inverting parity encoder using XNOR gates (e.g., alternative 6 in TABLE 1). Each parity bit PARITY [0]-PARITY [8] may be a logical combination of the data bits DATA[0]–DATA[127] defined by the PCM 54 and the logic value 0. The sixth embodiment of the parity encoder 60 may implement the following two rules to generate the inverted parity bits PARITY[0]-PARITY[8]:

Rule 1: When an even number of the data bits DATA[0]–DATA[127] are presented to the parity encoder 60, XNOR logic may be implemented to combine all of the data bits DATA[0]–DATA[127] that are presented to generate the respective inverted parity bit PARITY[0]-PARITY[8]; and/or Rule 2: When an odd number of the data bits DATA[0]–DATA[127] are presented to the parity encoder 60, XNOR logic may be implemented to combine all of the bits DATA[0]–DATA[127] that are presented and a logic 0 together to generate the respective inverted parity bit PARITY[0]-PARITY[8].

In a seventh embodiment, the parity encoder 60 may be implemented as a non-inverting parity encoder using XNOR gates with an output inverted by NOT gates (e.g., alternative 7 in TABLE 1). The seventh embodiment may be implemented similarly to the fifth embodiment described above. However, in one example, a NOT logic gate (e.g., an inverter) may be implemented on each parity output of the parity encoder 60 to generate the inverted parity bits PARITY[0]-PARITY[8]. However, any suitable inverting logic and/or circuitry may be implemented accordingly to meet the design criteria of a particular application.

In an eighth embodiment, the parity encoder 60 may be implemented as an inverting parity encoder using XNOR gates with an output inverted by NOT gates (e.g., alternative 8 in TABLE 1). The eighth embodiment may be implemented similarly to the sixth embodiment described above. However, in one example, a NOT logic gate (e.g., an inverter) may be implemented on each parity output of the parity encoder 60 to generate the inverted parity bits PARITY[0]-PARITY[8]. However, any suitable inverting logic and/or circuitry may be implemented accordingly to meet the design criteria of a particular application.

The syndrome encoder 62 generally presents the signal SYNDROME. The signal SYNDROME may be generated in response to a comparison of a new parity code generated from the data being read and a previously generated parity being read. The syndrome encoder 62 may generate the signal SYNDROME similarly to generation of the signal PARITY using the parity encoder 60. When the process 50 is implemented, eight alternatives of the syndrome encoder 62 may be configured. A first embodiment (e.g., alternative 1) of the syndrome encoder 62 may be a conventional design. The other seven alternative designs for the syndrome encoder 62 (e.g., alternatives 2–8) may comprise aspects of the present invention.

In a first embodiment, the syndrome encoder 62 may be implemented as a non-inverting syndrome encoder using XOR gates. The alternative 1 of the syndrome encoder 62 generally presents the syndrome bits SYNDROME[0]-SYNDROME[8] that are the logical combinations of the data bits DATA[0]–DATA[127] and the previous parity bits PARITY[0]-PARITY[8] generated using XOR gates. Each row of the PCM 54 may define the data bits DATA[0]–DATA[127] and the previous parity bits PARITY[0]-PARITY[8] to be combined to generate the given syndrome bit SYNDROME[0]-SYNDROME[8]. For example, on row 1 of the PCM 54, the parity bit PARITY[0] may define the syndrome bit SYNDROME[0] of the signal SYNDROME as the output. The syndrome bit SYNDROME[0] may be equal to the XOR combination of the data bits DATA[0]–DATA[27], DATA[84]–DATA[98], DATA[106], DATA[107], DATA[110], DATA[112], DATA[117], DATA[120], DATA[121], DATA[123], DATA[127] and the previous parity bit PARITY[0]. The syndrome bits SYNDROME[1]-SYNDROME[8] may be generated similarly to the syndrome bit SYNDROME[0].

In a second embodiment, the syndrome encoder 62 may be implemented as a non-inverting syndrome encoder using XOR gates with an output inverted by NOT gates. The second embodiment may be implemented similarly to the first embodiment described above. However, in one example, a NOT logic gate (e.g., an inverter) may be implemented on each output of the syndrome encoder 62 to generate the inverted syndrome bits SYNDROME[0]-SYNDROME[8]. However, any suitable inverting logic and/or circuitry may be implemented accordingly to meet the design criteria of a particular application.

In a third embodiment, the syndrome encoder 62 may be implemented as an inverting syndrome encoder using XOR gates. Each of the syndrome bits SYNDROME[0]-SYNDROME[8] may be a logical combination of the respective data bits DATA[0]–DATA[127] and a respective previous parity bit PARITY[0]-PARITY[8] defined by the PCM 54 and the logic value 1. Any logic value combined with logic 1 using an XOR gate, will generally result in the digital complement (e.g., opposite) of the logic value. Thus, the syndrome bit SYNDROME[0] may be equal to the XOR combination of the data bits DATA[0]–DATA[27], DATA [84]–DATA[98], DATA[106], DATA[107], DATA[110], DATA[112], DATA[117], DATA[120], DATA[121], DATA [123], DATA[127], the previous parity bit PARITY[0], and the logic 1. The syndrome bits SYNDROME [1]-SYNDROME [8] may be generated similarly to the syndrome bit SYNDROME[0].

In a fourth embodiment, the syndrome encoder 62 may be implemented as an inverting syndrome encoder using XOR gates with an output inverted by NOT gates. The fourth embodiment may be implemented similarly to the third embodiment described above. However, in one example, a NOT logic gate (e.g., an inverter) may be implemented on each output of the syndrome encoder 62 to generate the inverted syndrome bits SYNDROME[0]-SYNDROME[8]. However, any suitable inverting logic and/or circuitry may be implemented accordingly to meet the design criteria of a particular application.

In a fifth embodiment, the syndrome encoder 62 may be implemented as a non-inverting syndrome encoder using XNOR gates. Each syndrome bit SYNDROME[0]-SYNDROME[8] may be a logical combination of the data bits DATA[0]–DATA[127] and a respective one of the previous parity bits PARITY [0]-PARITY [8] and the logic value 0.

The fifth embodiment of the syndrome encoder 62 may implement the following two rules to generate the non-inverting syndrome bits SYNDROME[0]-SYNDROME[8]:

Rule 1: When an odd number of the data bits DATA[0]–DATA[127] and a previous parity bit PARITY[0]-PARITY [8] are presented to the syndrome encoder 62, XNOR logic gates may be implemented to generate the respective syndrome bit SYNDROME [0]-SYNDROME[8]; and/or Rule 2: When an even number of the data bits DATA[0]–DATA[127] and a previous parity bit PARITY[0]-PARITY [8] are presented to the syndrome encoder 62, XNOR logic gates may be implemented to combine all of the data bits DATA[0]–DATA[127] presented and a logic 0 together to generate the respective syndrome bit SYNDROME[0]–SYNDROME[8].

In a sixth embodiment, the syndrome encoder 62 may be implemented as a non-inverting syndrome encoder using XNOR gates with an output inverted by NOT gates. The sixth embodiment may be implemented similarly to the fifth embodiment described above. However, in one example, a NOT logic gate (e.g., an inverter) may be implemented on each output of the syndrome encoder 62 to generate the inverted syndrome bits SYNDROME[0]-SYNDROME[8]. However, any suitable inverting logic and/or circuitry may be implemented accordingly to meet the design criteria of a particular application.

In a seventh embodiment, of the syndrome encoder 62 may be implemented as an inverting syndrome encoder using XNOR gates. Each syndrome bit SYNDROME[0]-SYNDROME[8] may be a logical combination of the data bits DATA[0]–DATA[127] and a respective one of the previous parity bits PARITY [0]-PARITY [8] and the logic value 0.

The seventh embodiment of the syndrome encoder 62 may implement the following two rules to generate the inverting syndrome bits SYNDROME[0]-SYNDROME[8]:

Rule 1: When an even number of the data bits DATA[0] –DATA[127] and a previous parity bit PARITY[0]-PARITY [8] are presented to the syndrome encoder 62, XNOR logic gates may be implemented to generate the respective inverted syndrome bit SYNDROME[0]-SYNDROME[8]; and/or Rule 2: When an odd number of the data bits DATA[0] –DATA[127] and a previous parity bit PARITY[0]-PARITY [8] are presented to the syndrome encoder 62, XNOR logic gates may be implemented to combine all of the data bits DATA[0]–DATA[127] presented and a logic 0 together to generate the respective inverted syndrome bit SYNDROME [0]-SYNDROME[8].

In an eighth embodiment, the syndrome encoder 62 may be implemented as an inverting syndrome encoder using XNOR gates with an output inverted by NOT gates. The eighth embodiment may be implemented similarly to the seventh embodiment described above. However, in one example, a NOT logic gate (e.g., an inverter) may be implemented on each output of the syndrome encoder 62 to generate the non-inverted syndrome bits SYNDROME [0]-SYNDROME [8]. However, any suitable inverting logic and/or circuitry may be implemented accordingly to meet the design criteria of a particular application.

TABLE 2 may summarize the output of the syndrome encoder 62 as a function of (i) the polarity of signals DATA and PARITY read from SRAM and (ii) the embodiment of the syndrome encoder 62 that has been implemented.

TABLE 2

| Non-Inverted Data and Parity Polarity Read from SRAM | Syndrome Encoder 62 Type | Syndrome Encoder 62 Output |
| --- | --- | --- |
| Non-Inverted | Non-Inverting (or Inverting with NOT) | Non-Inverting |
| Non-Inverted | Inverting (or Non-Inverting with NOT) | Inverting |
| Inverted | Non-Inverting (or Inverting with NOT) | Inverting |
| Inverted | Inverting (or Non-Inverting with NOT) | Non-Inverting |

Figure 2:
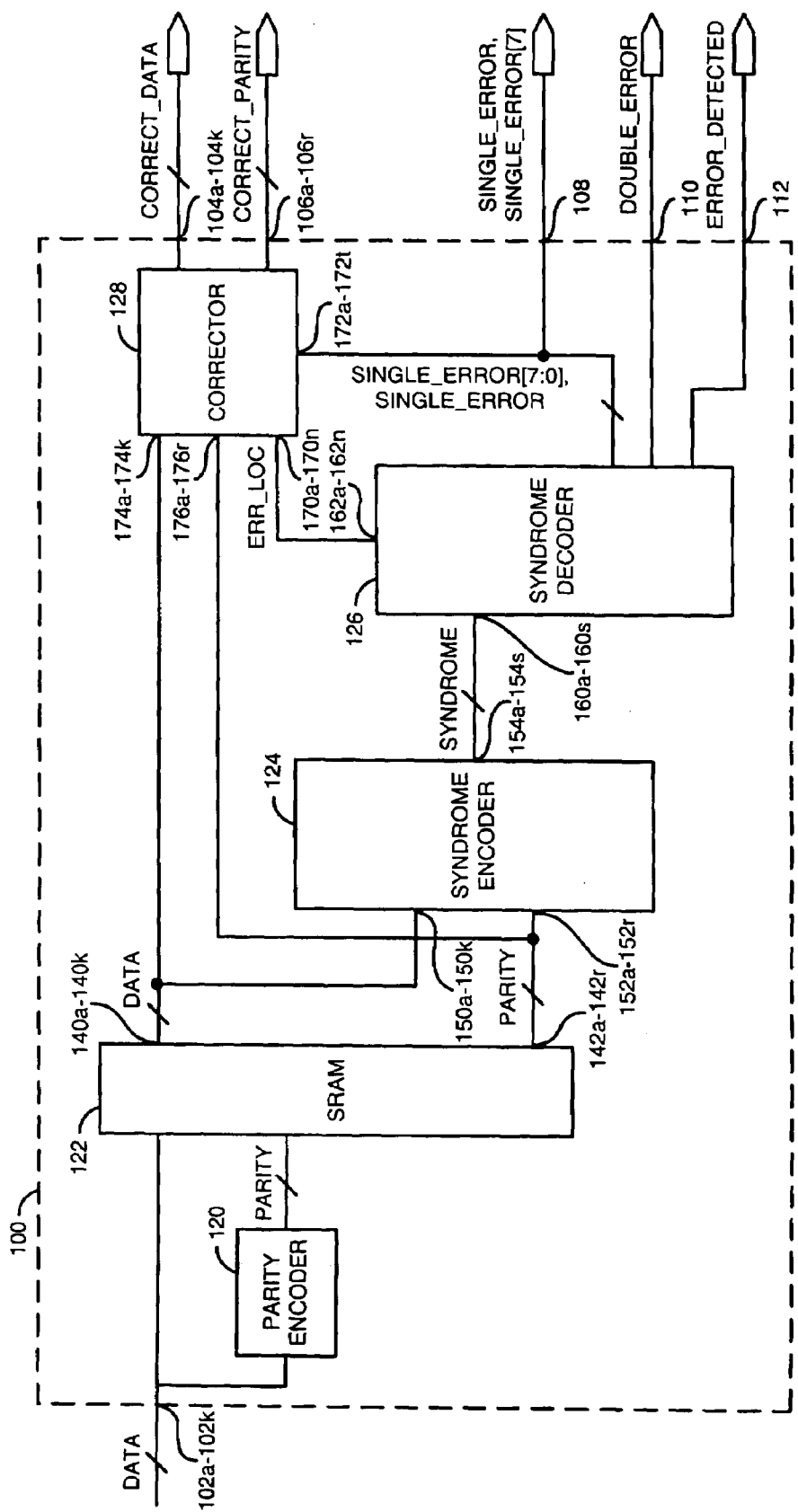
FIG. 2 is a block diagram of an error control coding memory circuit in accordance with a preferred embodiment the present invention.

Referring to FIG. 2, a block diagram of a circuit 100 is shown in accordance with a preferred embodiment of the present invention. In one example, the circuit 100 may be implemented as a semiconductor memory read and write circuit having an optimized single error correcting and double error detecting (SEC-DED) code and logic for the correction of soft errors. The circuit 100 may be implemented in accordance with the process 50.

The circuit 100 may have one or more inputs 102a–102k that may receive the signal DATA, one or more outputs 104a–104k that may present a signal (e.g., CORRECT_DATA), one or more outputs 106a–106r that may present a signal (e.g., CORRECT_PARITY), an output 108 that may present a signal (e.g., SINGLE_ERROR), an output 110 that may present a signal (e.g., DOUBLE_ERROR), and an output 112 that may present a signal (e.g., ERROR_DETECTED). The signal DATA may be a data input signal written to the circuit 100. The signal CORRECT_DATA may be implemented as a k-bit digital signal. The signal CORRECT_DATA may be a data signal presented by the circuit 100 during a memory read operation of the circuit 100. The signal CORRECT_DATA may be a corrected representation of the signal DATA. The circuit 100 may be configured to correct single errors and detect double errors as the signal CORRECT_DATA is read from the circuit 100.

The signal CORRECT_PARITY may be implemented as an r-bit digital signal, where r is an integer. The signal CORRECT_PARITY may be a corrected representation of a parity signal. The signal CORRECT_PARITY may be a parity signal presented by the circuit 100 during a memory read operation of the circuit 100. The circuit 100 may be configured to correct single errors and detect double errors that occur within the signal PARITY.

In one example, the signal SINGLE_ERROR may be implemented as a single bit digital signal. In another example, the signal SINGLE_ERROR may be implemented as a t-bit digital signal, where t is an integer. In one example, the integer t may be equal to eight (e.g., SINGLE_ERROR [7:0]). However, the signal SINGLE_ERROR may be implemented having other bit widths accordingly to meet the design criteria of a particular application. In one example, the circuit 100 may present a single bit (e.g., SINGLE_ERROR[7]) of the signal SINGLE_ERROR. However, other bits or bit combinations of the signal SINGLE_ERROR may be presented to meet the design criteria of a particular application. The signal SINGLE_ERROR may be used to indicate that a single bit error was detected and corrected by the circuit 100 in the signals CORRECT_DATA and/or CORRECT_PARITY.

The signal DOUBLE_ERROR may be used to indicate that a double bit error was detected by the circuit 100 in the signals CORRECT_DATA and/or CORRECT_PARITY. The signal ERROR_DETECTED may be used to indicated that a single and/or double bit error was detected by the circuit 100 during a read operation of the signals DATA and/or PARITY.

The circuit 100 may comprise a circuit 120, a circuit 122, a circuit 124, a circuit 126, and a circuit 128. The circuit 120 may be implemented as a parity encoder circuit. The circuit 120 may be implemented similarly to the parity encoder circuit 60. The circuit 122 may be implemented as a static random access memory (SRAM). However, other types of memory (e.g., dynamic random access memory (DRAM), etc.) may be implemented accordingly to meet the design criteria of a particular application. The circuit 124 may be implemented as a syndrome encoder circuit. The circuit 124 may be implemented similarly to the syndrome encoder circuit 62. The circuit 126 may be implemented as a syndrome decoder circuit. The circuit 128 may be implemented as an error corrector circuit. Additionally, top level circuitry and/or coding (not shown) may be implemented to bind components of the circuit 100.

The circuit 120 may have one or more inputs that may receive the signal DATA and one or more outputs that may present the signal PARITY. The circuit 120 may be implemented in accordance with any of the parity encoder circuit 60 embodiments as described in connection with TABLE 1 (above) to meet the design criteria of a particular application.

The circuit 122 may have one or more inputs that may receive the signal DATA, one or more inputs that may receive the signal PARITY, one or more outputs 140a–140k that may present the signal DATA, and one or more outputs 142a–142r that may present the signal PARITY. The signals DATA and PARITY may be written to, stored in, and read from the circuit 122.

The circuit 124 may have one or more inputs 150a–150k that may receive the signal DATA, one or more inputs 152a–152r that may receive the signal PARITY, and one or more outputs 154a–154s that may present the signal SYNDROME. The circuit 124 may be implemented in accordance with any of the syndrome encoder circuit 62 embodiments as described in connection with TABLE 2 (above) to meet the design criteria of a particular application.

The circuit 126 may have one or more inputs 160a–160s that may receive the signal SYNDROME, one or more outputs 162a–162n that may present a signal (e.g., ERR_LOC), one or more outputs that may present the signal SINGLE_ERROR, an output that may present the signal DOUBLE_ERROR, and an output that may present the signal ERROR_DETECTED. The signal ERR_LOC may be implemented as an n-bit digital signal, where n is an integer. The signal ERR_LOC may be generated by the circuit 126 to describe the memory location of a single bit error detected in the signals DATA and/or PARITY. The signal ERR_LOC may be generated in response to the signal SYNDROME.

The circuit 128 may have one or more inputs 170a–170n that may receive the signal ERR_LOC, one or more inputs 172a–172(t) that may receive the signal SINGLE_ERROR, one or more inputs 174a–174k that may receive the signal DATA, one or more inputs 176a–176r that may receive the signal PARITY, one or more outputs that may present the signal CORRECT_DATA, and one or more outputs that may present the signal CORRECT_PARITY. The circuit 128 may be configured to present the signals CORRECT_DATA and CORRECT_PARITY in response to the signals DATA, PARITY, ERR_LOC and SINGLE_ERROR.

Figure 3:
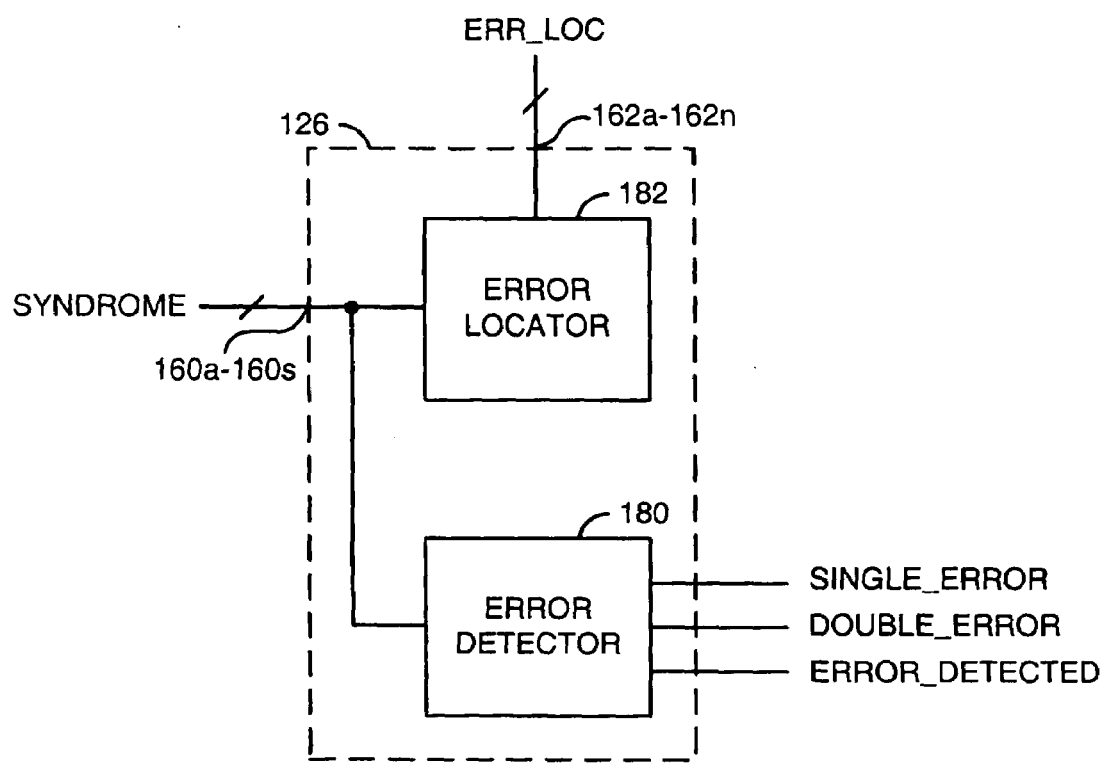
FIG. 3 is a block diagram of a syndrome decoder circuit of FIG. 2.

Referring to FIG. 3, a detailed block diagram of the circuit 126 of FIG. 2 is shown. The circuit 126 may comprise a circuit 180 and a circuit 182. The circuit 180 may be implemented as an error detector circuit. The circuit 182 may be implemented as an error locator circuit. The circuit 182 may be implemented similarly to the error locator circuit 64.

When a non-inverted syndrome error detector 180 is implemented and all of the bits of the signal SYNDROME are 0, no error, either single or double, is generally detected. When the signal SYNDROME has one or more non-zero bits, signals corresponding to (i) either a single error or a double error detected and (ii) an error detected may be generated. When the signal SYNDROME is equal to a column in the PCM 54, signals corresponding to an error detected and a single error detected may be generated. When the signal SYNDROME does not correspond to any column in the PCM 54, signals corresponding to an error detected and a double error detected may be generated.

Figure 4:
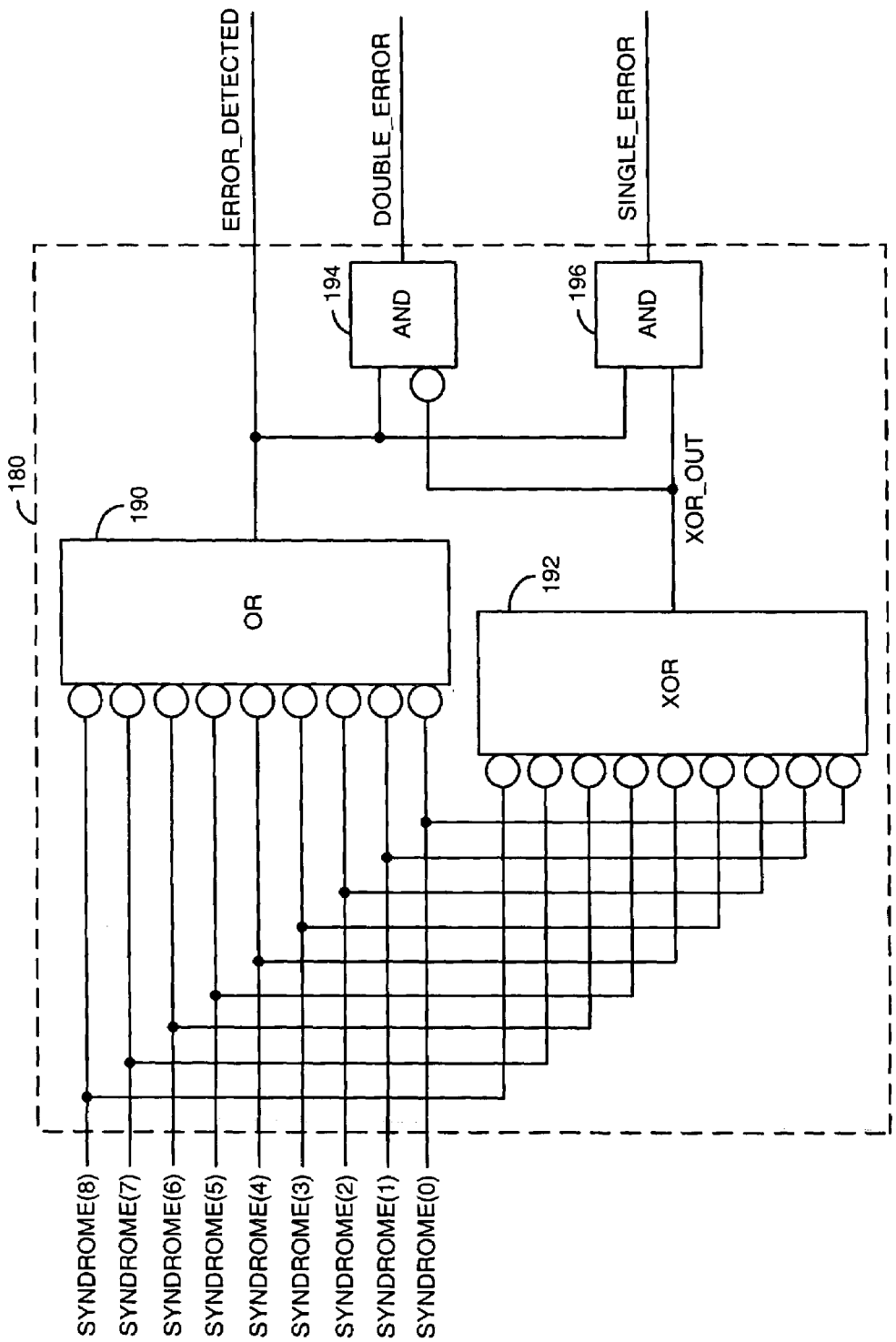
FIG. 4 is a block diagram of an inverted syndrome error detector of FIG. 3.

Referring to FIG. 4, a block diagram of the circuit 180 of FIG. 3 is shown. In one example, the circuit 180 may be implemented as an inverted syndrome error detector. The circuit 180 may comprise a device 190, a device 192, a device 194, and device 196. The device 190 may be implemented as an OR gate. The device 192 may be implemented as an XOR gate. The devices 194 and 196 may be implemented as AND gates. The device 190 may have one or more inputs that each may receive a respective bit of the signal SYNDROME (e.g., SYNDROME[0]-SYNDROME[8]) and an output that may present the signal ERROR_DETECTED.

The device 192 may have one or more inputs that each may receive a respective bit of the signal SYNDROME and an output that may present a signal (e.g., XOR_OUT). The signal XOR_OUT may be an intermediate signal implemented to distinguish between a single bit error and a double bit error when an error is detected in the signals DATA and/or PARITY during the read operation of the circuit 122. Each input of the circuits 190 and 192 may be configured as an inverting input. The circuit 180 may be configured to detect errors as indicated by inverted syndromes (e.g., the signal SYNDROME).

The device 194 may have a non-inverting input that may receive the signal ERROR_DETECTED, an inverting input that may receive the signal XOR_OUT, and an output that may present the signal DOUBLE_ERROR. The signal DOUBLE_ERROR may be generated in response to the signal ERROR_DETECTED and the inverse of the signal XOR_OUT. The circuit 196 may have an input that may receive the signal ERROR_DETECTED, an input that may receive the signal XOR_OUT, and an output that may present the signal SINGLE_ERROR. The signal SINGLE_ERROR may be generated in response to the signals ERROR_DETECTED and XOR_OUT. In alternative embodiments of the circuit 180, the devices 190, 192, 194, and 196 may be implemented as different types of logic gates (e.g., XNOR, NAND, etc.) accordingly to meet the design criteria of a particular application.

Figure 5:
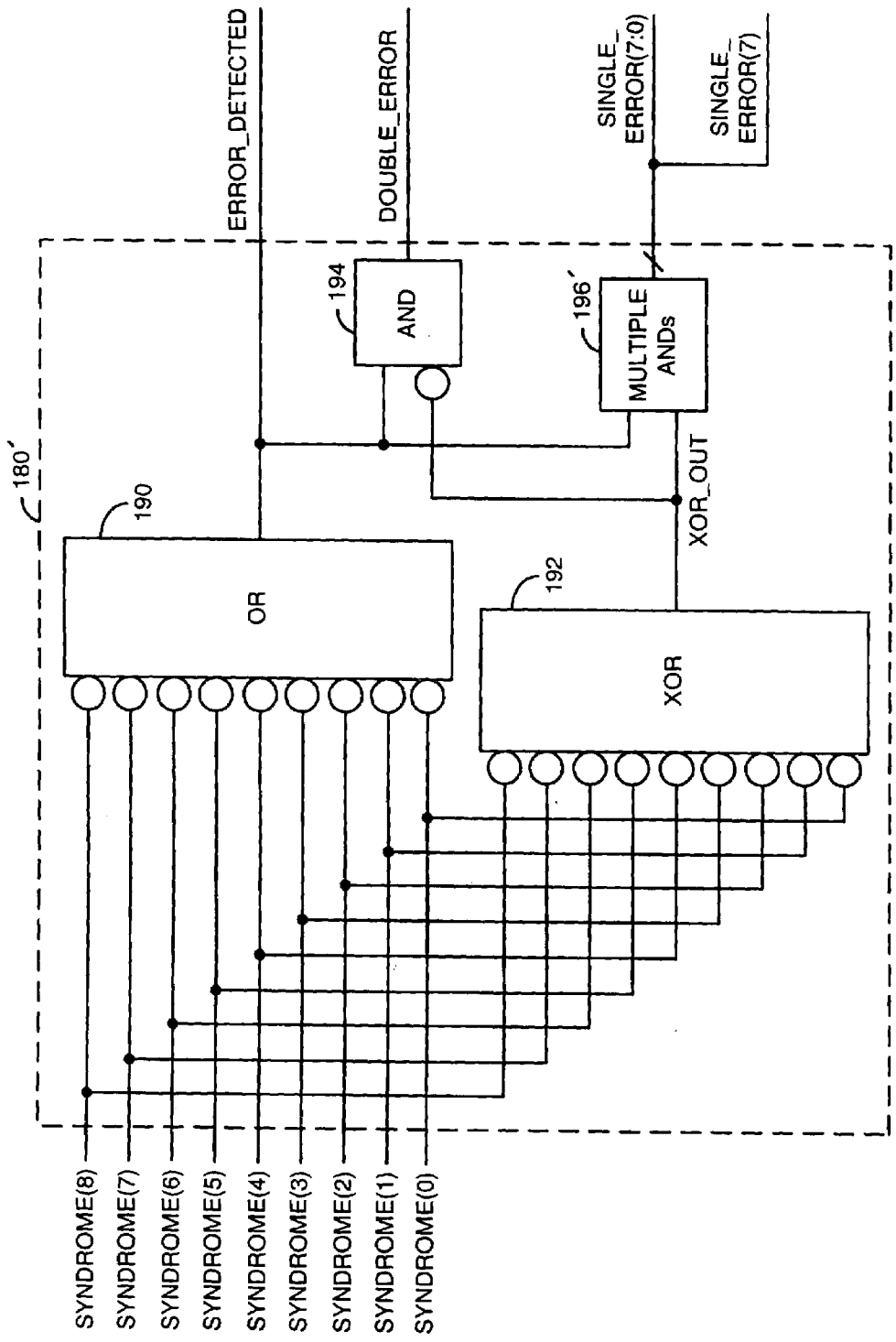
FIG. 5 is a block diagram of an alternative embodiment of the inverted syndrome error detector of FIG. 3.

Referring to FIG. 5, a block diagram of a circuit 180' illustrating an alternative embodiment of the circuit 180 is shown. The circuit 180' may be implemented similarly to the circuit 180. In one example, the circuit 180' may be implemented as an inverted syndrome error detector with multiple single error signals. The circuit 180' may comprise a device 196'. The device 196' may be implemented as multiple AND logic gates. The signal SINGLE_ERROR may be a multiple-bit digital signal. The circuit 180' may present the signal SINGLE_ERROR[7] at the output 108 and the signals SINGLE_ERROR[7:0] to the inputs 172a-172(t) of the circuit 128. The circuit 180' may reduce the loading on the signal SINGLE_ERROR. In one example, the circuit 180' may reduce the signal propagation delay of the circuit 100 by 0.1 ns when compared to an implementation of the circuit 100 using the circuit 180. In alternative embodiments of the circuit 180', the devices 190, 192, 194, and 196' may be implemented as different types of logic gates (e.g., XNOR, NAND, etc.) in order to meet the design criteria of a particular application.

Referring back to FIG. 3, the circuit 182 may have logic configured to implement an error location signal in response to the PCM 54. The signal ERR_LOC corresponding to each bit of the signal DATA and each bit of the signal PARITY may be generated in response to the signal SYNDROME. The error locator circuit 182 may include AND logic for combining all of the bits of the syndrome appropriately for each bit of the signals DATA and PARITY. For example, in the error locator circuit 182 for the bit DATA[84], the error locator signal ERR_LOC may equal the syndrome bits SYNDROME[1] AND SYNDROME[2] AND SYNDROME[3] AND SYNDROME[4] AND SYNDROME[5] AND (NOT SYNDROME[6]) AND (NOT SYNDROME [7]) AND (NOT SYNDROME[8]) AND (NOT SYNDROME[9]). Similarly, an equation that defines the appropriate AND logic relationship may be derived from the DATA[0] column of the PCM 54. However, an error locator circuit 182 that includes AND gates to logically combine each bit of the signal SYNDROME for each bit of the error locator signal ERR_LOC may include many logic gates.

The present invention may be implemented using less than all of the bits SYNDROME [0]-SYNDROME [8] to generate each bit of the signal ERR_LOC. For example, the bit of the signal ERR_LOC corresponding to the bit 84 of the signal DATA (e.g., DATA[84]) may be generated using the logical combination of the bits SYNDROME[1] AND SYNDROME [2] AND SYNDROME [3] AND SYNDROME [4] AND SYNDROME [5] of the signal SYNDROME. The bits of the signal ERR_LOC corresponding to the data bits DATA[84:127] may be generated similarly. However, the columns of the PCM 54 corresponding to bits DATA[0]–DATA[83] of the signal DATA generally have only 3 bits equal to digital 1. The columns of the PCM 54 corresponding to bits of the signal PARITY (e.g., bit PARITY[0]-PARITY[8]) generally have only one bit equal to digital 1. The bits of the signal ERR_LOC corresponding to the data bits DATA[0]–DATA[83] and the bits of the signal PARITY may implement equations other than the equations implemented to generate the respective bits of the signal ERR_LOC corresponding to the data bits DATA[84]–DATA[127]. The present invention may implement logic within the circuit 182 to generate the bits of the signal ERR_LOC corresponding to the data bits DATA[0]–DATA[83] and the parity bits PARITY[0]-PARITY[8].

When only three bits of the signal SYNDROME are used to generate bits of the signal ERR_LOC, improper values for the signal ERR_LOC may be generated. For example, for the bit DATA[0], when the respective bit of the signal ERR_LOC equals SYNDROME[1] AND SYNDROME[2] AND SYNDROME[3], the error locator may be turned "on" (e.g., the signal ERROR_DETECTED may be asserted) when any of the bits DATA[84], DATA[86], DATA[91], DATA[117], or DATA[121] are turned "on". However, only one error locator generally turns "on" at each read cycle. Since the circuit 100 is generally implemented using single error correcting and double error detecting (SEC-DED) code and/or logic, the ECC implemented in the circuit 100 may correct only one error at a time.

To overcome the potential for an improper value for the signals ERR_LOC and ERROR_DETECTED, the present invention may implement the bits of signal ERR_LOC corresponding to the data bit DATA[0] as equal to SYNDROME[1] AND SYNDROME[2] AND SYNDROME[3] AND (NOT SYNDROME[4]) AND (NOT SYNDROME [5]). Therefore, turning "on" the bits of the signal ERR_LOC corresponding to the data bits DATA[84], DATA[86], DATA[91], DATA[117], or DATA[121] may not turn "on" the bit of the signal ERR_LOC corresponding to the data bit DATA[0]. The bits of the signal ERR_LOC corresponding to the data bits DATA[84], DATA[91], and DATA[117] generally only turn "on" when the syndrome bit SYNDROME[4] is turned "on". The bits of the signal ERR_LOC corresponding to the data bits DATA[84], DATA[86], and DATA[121] generally only turn "on" when the syndrome bit SYNDROME[5] is turned "on". The logic for the signal ERR_LOC corresponding to the data bits DATA[1]–DATA[83] may be similarly defined.

The signal ERR_LOC may be generated using logic and/or coding that may ensure only one bit of the signal ERR_LOC will be a digital 1 when there is a single error or odd number of errors in the signals DATA and PARITY. In one example, the bits of the signal ERR_LOC corresponding to the signals DATA and PARITY may be generated according to the following logic and/or coding:

| | Error Location Signal ERR_LOC Generation for the Signal DATA |
|---|---|
| DATA | ERR_LOC |
| DATA[127] | NOT SYNDROME[8] AND NOT SYNDROME[7] AND NOT SYNDROME[3] AND NOT SYNDROME[2] AND NOT SYNDROME[0] |
| DATA[126] | NOT SYNDROME[8] AND NOT SYNDROME[7] AND |

-continued

Error Location Signal ERR_LOC
Generation for the Signal DATA

| DATA | ERR_LOC |
|---|---|
|  | NOT SYNDROME[6] AND NOT SYNDROME[4] AND NOT SYNDROME[3] |
| DATA[125] | NOT SYNDROME[8] AND NOT SYNDROME[6] AND NOT SYNDROME[5] AND NOT SYNDROME[4] AND NOT SYNDROME[3] |
| DATA[124] | NOT SYNDROME[8] AND NOT SYNDROME[5] AND NOT SYNDROME[3] AND NOT SYNDROME[2] AND NOT SYNDROME[1] |
| DATA[123] | NOT SYNDROME[8] AND NOT SYNDROME[7] AND NOT SYNDROME[5] AND NOT SYNDROME[2] AND NOT SYNDROME[0] |
| DATA[122] | NOT SYNDROME[8] AND NOT SYNDROME[7] AND NOT SYNDROME[5] AND NOT SYNDROME[2] AND NOT SYNDROME[1] |
| DATA[121] | NOT SYNDROME[8] AND NOT SYNDROME[4] AND NOT SYNDROME[2] AND NOT SYNDROME[1] AND NOT SYNDROME[0] |
| DATA[120] | NOT SYNDROME[8] AND NOT SYNDROME[7] AND NOT SYNDROME[4] AND NOT SYNDROME[2] AND NOT SYNDROME[0] |
| DATA[119] | NOT SYNDROME[8] AND NOT SYNDROME[7] AND NOT SYNDROME[6] AND NOT SYNDROME[4] AND NOT SYNDROME[2] |
| DATA[118] | NOT SYNDROME[7] AND NOT SYNDROME[6] AND NOT SYNDROME[5] AND NOT SYNDROME[4] AND NOT SYNDROME[2] |
| DATA[117] | NOT SYNDROME[8] AND NOT SYNDROME[3] AND NOT SYNDROME[2] AND NOT SYNDROME[1] AND NOT SYNDROME[0] |
| DATA[116] | NOT SYNDROME[8] AND NOT SYNDROME[5] AND NOT SYNDROME[4] AND NOT SYNDROME[3] AND NOT SYNDROME[2] |
| DATA[115] | NOT SYNDROME[8] AND NOT SYNDROME[7] AND NOT SYNDROME[6] AND NOT SYNDROME[3] AND NOT SYNDROME[2] |
| DATA[114] | NOT SYNDROME[7] AND NOT SYNDROME[6] AND NOT SYNDROME[5] AND NOT SYNDROME[3] AND NOT SYNDROME[2] |
| DATA[113] | NOT SYNDROME[6] AND NOT SYNDROME[5] AND NOT SYNDROME[4] AND NOT SYNDROME[3] AND NOT SYNDROME[2] |
| DATA[112] | NOT SYNDROME[8] AND NOT SYNDROME[7] AND NOT SYNDROME[5] AND NOT SYNDROME[1] AND NOT SYNDROME[0] |
| DATA[111] | NOT SYNDROME[8] AND NOT SYNDROME[7] AND NOT SYNDROME[6] AND NOT SYNDROME[5] AND NOT SYNDROME[1] |
| DATA[110] | NOT SYNDROME[8] AND NOT SYNDROME[7] AND NOT SYNDROME[4] AND NOT SYNDROME[1] AND NOT SYNDROME[0] |
| DATA[109] | NOT SYNDROME[8] AND NOT SYNDROME[7] AND NOT SYNDROME[6] AND NOT SYNDROME[4] AND NOT SYNDROME[1] |
| DATA[108] | NOT SYNDROME[7] AND NOT SYNDROME[6] AND NOT SYNDROME[5] AND NOT SYNDROME[4] AND NOT SYNDROME[1] |
| DATA[107] | NOT SYNDROME[6] AND NOT SYNDROME[4] AND NOT SYNDROME[3] AND NOT SYNDROME[1] AND NOT SYNDROME[0] |
| DATA[106] | NOT SYNDROME[8] AND NOT SYNDROME[7] AND NOT SYNDROME[3] AND NOT SYNDROME[1] AND NOT SYNDROME[0] |
| DATA[105] | NOT SYNDROME[8] AND NOT SYNDROME[7] AND NOT SYNDROME[6] AND NOT SYNDROME[3] AND NOT SYNDROME[1] |
| DATA[104] | NOT SYNDROME[6] AND NOT SYNDROME[5] AND NOT SYNDROME[4] AND NOT SYNDROME[3] AND NOT SYNDROME[1] |
| DATA[103] | NOT SYNDROME[8] AND NOT SYNDROME[7] AND NOT SYNDROME[3] AND NOT SYNDROME[2] AND NOT SYNDROME[1] |
| DATA[102] | NOT SYNDROME[8] AND NOT SYNDROME[7] AND NOT SYNDROME[6] AND NOT SYNDROME[2] AND NOT SYNDROME[1] |
| DATA[101] | NOT SYNDROME[6] AND NOT SYNDROME[5] AND NOT SYNDROME[3] AND NOT SYNDROME[2] AND NOT SYNDROME[1] |
| DATA[100] | NOT SYNDROME[6] AND NOT SYNDROME[5] AND NOT SYNDROME[4] AND NOT SYNDROME[2] AND NOT SYNDROME[1] |
| DATA[99] | NOT SYNDROME[5] AND NOT SYNDROME[4] AND NOT SYNDROME[3] AND NOT SYNDROME[2] AND NOT SYNDROME[1] |
| DATA[98] | NOT SYNDROME[8] AND NOT SYNDROME[7] AND NOT SYNDROME[6] AND NOT SYNDROME[5] AND NOT SYNDROME[0] |
| DATA[97] | NOT SYNDROME[8] AND NOT SYNDROME[7] AND NOT SYNDROME[6] AND NOT SYNDROME[4] AND NOT SYNDROME[0] |
| DATA[96] | NOT SYNDROME[7] AND NOT SYNDROME[6] AND NOT SYNDROME[5] AND NOT SYNDROME[4] AND NOT SYNDROME[0] |
| DATA[95] | NOT SYNDROME[8] AND NOT SYNDROME[7] AND NOT SYNDROME[6] AND NOT SYNDROME[3] AND NOT SYNDROME[0] |
| DATA[94] | NOT SYNDROME[7] AND NOT SYNDROME[5] AND NOT SYNDROME[4] AND NOT SYNDROME[3] AND NOT SYNDROME[0] |
| DATA[93] | NOT SYNDROME[6] AND NOT SYNDROME[5] AND NOT SYNDROME[4] AND NOT SYNDROME[3] AND NOT SYNDROME[0] |
| DATA[92] | NOT SYNDROME[8] AND NOT SYNDROME[7] AND NOT SYNDROME[6] AND NOT SYNDROME[2] AND NOT SYNDROME[0] |
| DATA[91] | NOT SYNDROME[5] AND NOT SYNDROME[3] AND NOT SYNDROME[2] AND NOT SYNDROME[1] AND NOT SYNDROME[0] |
| DATA[90] | NOT SYNDROME[6] AND NOT SYNDROME[5] AND NOT SYNDROME[4] AND NOT SYNDROME[2] AND NOT SYNDROME[0] |
| DATA[89] | NOT SYNDROME[5] AND NOT SYNDROME[4] AND NOT SYNDROME[3] AND NOT SYNDROME[2] AND NOT SYNDROME[0] |
| DATA[88] | NOT SYNDROME[8] AND NOT SYNDROME[7] AND NOT SYNDROME[6] AND NOT SYNDROME[1] AND NOT SYNDROME[0] |
| DATA[87] | NOT SYNDROME[6] AND NOT SYNDROME[5] AND NOT SYNDROME[3] AND NOT SYNDROME[1] AND NOT SYNDROME[0] |
| DATA[86] | NOT SYNDROME[5] AND NOT SYNDROME[4] AND NOT SYNDROME[2] AND NOT SYNDROME[1] AND NOT SYNDROME[0] |
| DATA[85] | NOT SYNDROME[5] AND NOT SYNDROME[4] AND NOT SYNDROME[3] AND NOT SYNDROME[1] AND NOT SYNDROME[0] |
| DATA[84] | NOT SYNDROME[4] AND NOT SYNDROME[3] AND NOT SYNDROME[2] AND NOT SYNDROME[1] AND NOT SYNDROME[0] |
| DATA[83] | NOT SYNDROME[8] AND NOT SYNDROME[7] AND NOT SYNDROME[6] AND SYNDROME[0] AND SYNDROME[1] AND SYNDROME[2] AND SYNDROME[4] |
| DATA[82] | NOT SYNDROME[8] AND NOT SYNDROME[7] AND NOT SYNDROME[5] AND SYNDROME[0] AND SYNDROME[1] |
| DATA[81] | NOT SYNDROME[8] AND NOT SYNDROME[6] AND NOT SYNDROME[5] AND SYNDROME[4] AND SYNDROME[7] |
| DATA[80] | NOT SYNDROME[7] AND NOT SYNDROME[6] AND NOT SYNDROME[5] AND SYNDROME[0] AND SYNDROME[1] AND SYNDROME[2] |
| DATA[79] | NOT SYNDROME[8] AND NOT SYNDROME[7] AND NOT SYNDROME[4] AND SYNDROME[0] AND SYNDROME[6] |
| DATA[78] | NOT SYNDROME[8] AND NOT SYNDROME[6] AND NOT SYNDROME[4] AND SYNDROME[5] AND SYNDROME[7] |
| DATA[77] | NOT SYNDROME[7] AND NOT SYNDROME[6] AND |

Error Location Signal ERR_LOC Generation for the Signal DATA

| DATA | ERR_LOC |
|---|---|
| | NOT SYNDROME[4] AND SYNDROME[5] AND SYNDROME[8] |
| DATA[76] | NOT SYNDROME[8] AND NOT SYNDROME[5] AND NOT SYNDROME[4] AND SYNDROME[3] |
| DATA[75] | NOT SYNDROME[7] AND NOT SYNDROME[5] AND NOT SYNDROME[4] AND SYNDROME[3] AND SYNDROME[6] |
| DATA[74] | NOT SYNDROME[6] AND NOT SYNDROME[5] AND NOT SYNDROME[4] AND SYNDROME[2] AND SYNDROME[3] AND SYNDROME[7] |
| DATA[73] | NOT SYNDROME[8] AND NOT SYNDROME[7] AND NOT SYNDROME[3] AND SYNDROME[0] AND SYNDROME[2] AND SYNDROME[6] |
| DATA[72] | NOT SYNDROME[8] AND NOT SYNDROME[6] AND NOT SYNDROME[3] AND SYNDROME[4] AND SYNDROME[7] |
| DATA[71] | NOT SYNDROME[7] AND NOT SYNDROME[6] AND NOT SYNDROME[3] AND SYNDROME[5] AND SYNDROME[8] |
| DATA[70] | NOT SYNDROME[8] AND NOT SYNDROME[5] AND NOT SYNDROME[3] AND SYNDROME[2] AND SYNDROME[4] |
| DATA[69] | NOT SYNDROME[7] AND NOT SYNDROME[5] AND NOT SYNDROME[3] AND SYNDROME[2] AND SYNDROME[4] |
| DATA[68] | NOT SYNDROME[6] AND NOT SYNDROME[5] AND NOT SYNDROME[3] AND SYNDROME[1] AND SYNDROME[2] AND SYNDROME[4] |
| DATA[67] | NOT SYNDROME[8] AND NOT SYNDROME[4] AND NOT SYNDROME[3] AND SYNDROME[5] AND SYNDROME[6] |
| DATA[66] | NOT SYNDROME[7] AND NOT SYNDROME[4] AND NOT SYNDROME[3] AND SYNDROME[0] AND SYNDROME[6] |
| DATA[65] | NOT SYNDROME[6] AND NOT SYNDROME[4] AND NOT SYNDROME[3] AND SYNDROME[1] AND SYNDROME[5] AND SYNDROME[7] |
| DATA[64] | NOT SYNDROME[5] AND NOT SYNDROME[4] AND NOT SYNDROME[3] AND SYNDROME[0] AND SYNDROME[2] AND SYNDROME[6] |
| DATA[63] | NOT SYNDROME[8] AND NOT SYNDROME[7] AND NOT SYNDROME[2] AND SYNDROME[0] AND SYNDROME[1] AND SYNDROME[6] |
| DATA[62] | NOT SYNDROME[8] AND NOT SYNDROME[6] AND NOT SYNDROME[2] AND SYNDROME[7] |
| DATA[61] | NOT SYNDROME[7] AND NOT SYNDROME[6] AND NOT SYNDROME[2] AND SYNDROME[5] AND SYNDROME[8] |
| DATA[60] | NOT SYNDROME[8] AND NOT SYNDROME[5] AND NOT SYNDROME[2] AND SYNDROME[3] AND SYNDROME[7] |
| DATA[59] | NOT SYNDROME[7] AND NOT SYNDROME[5] AND NOT SYNDROME[2] AND SYNDROME[6] AND SYNDROME[8] |
| DATA[58] | NOT SYNDROME[6] AND NOT SYNDROME[5] AND NOT SYNDROME[2] AND SYNDROME[3] AND SYNDROME[4] |
| DATA[57] | NOT SYNDROME[8] AND NOT SYNDROME[4] AND NOT SYNDROME[2] AND SYNDROME[0] AND SYNDROME[3] AND SYNDROME[6] |
| DATA[56] | NOT SYNDROME[7] AND NOT SYNDROME[4] AND NOT SYNDROME[2] AND SYNDROME[0] AND SYNDROME[6] |
| DATA[55] | NOT SYNDROME[6] AND NOT SYNDROME[4] AND NOT SYNDROME[2] AND SYNDROME[5] AND SYNDROME[8] |
| DATA[54] | NOT SYNDROME[5] AND NOT SYNDROME[4] AND NOT SYNDROME[2] AND SYNDROME[0] AND SYNDROME[3] AND SYNDROME[6] |
| DATA[53] | NOT SYNDROME[8] AND NOT SYNDROME[3] AND NOT SYNDROME[2] AND SYNDROME[1] AND SYNDROME[4] AND SYNDROME[7] |
| DATA[52] | NOT SYNDROME[7] AND NOT SYNDROME[3] AND NOT SYNDROME[2] AND SYNDROME[6] AND SYNDROME[8] |

Error Location Signal ERR_LOC Generation for the Signal DATA

| DATA | ERR_LOC |
|---|---|
| DATA[51] | NOT SYNDROME[6] AND NOT SYNDROME[3] AND NOT SYNDROME[2] AND SYNDROME[5] AND SYNDROME[8] |
| DATA[50] | NOT SYNDROME[5] AND NOT SYNDROME[3] AND NOT SYNDROME[2] AND SYNDROME[1] AND SYNDROME[4] AND SYNDROME[6] |
| DATA[49] | NOT SYNDROME[4] AND NOT SYNDROME[3] AND NOT SYNDROME[2] AND SYNDROME[1] AND SYNDROME[5] |
| DATA[48] | NOT SYNDROME[8] AND NOT SYNDROME[7] AND NOT SYNDROME[1] AND SYNDROME[0] AND SYNDROME[2] AND SYNDROME[6] |
| DATA[47] | NOT SYNDROME[8] AND NOT SYNDROME[6] AND NOT SYNDROME[1] AND SYNDROME[7] |
| DATA[46] | NOT SYNDROME[7] AND NOT SYNDROME[6] AND NOT SYNDROME[1] AND SYNDROME[4] AND SYNDROME[8] |
| DATA[45] | NOT SYNDROME[8] AND NOT SYNDROME[5] AND NOT SYNDROME[1] AND SYNDROME[3] AND SYNDROME[7] |
| DATA[44] | NOT SYNDROME[7] AND NOT SYNDROME[5] AND NOT SYNDROME[1] AND SYNDROME[6] AND SYNDROME[8] |
| DATA[43] | NOT SYNDROME[6] AND NOT SYNDROME[5] AND NOT SYNDROME[1] AND SYNDROME[3] AND SYNDROME[4] AND SYNDROME[7] |
| DATA[42] | NOT SYNDROME[8] AND NOT SYNDROME[4] AND NOT SYNDROME[1] AND SYNDROME[0] AND SYNDROME[6] |
| DATA[41] | NOT SYNDROME[7] AND NOT SYNDROME[4] AND NOT SYNDROME[1] AND SYNDROME[0] AND SYNDROME[6] |
| DATA[40] | NOT SYNDROME[6] AND NOT SYNDROME[4] AND NOT SYNDROME[1] AND SYNDROME[2] AND SYNDROME[3] AND SYNDROME[7] |
| DATA[39] | NOT SYNDROME[5] AND NOT SYNDROME[4] AND NOT SYNDROME[1] AND SYNDROME[2] AND SYNDROME[3] AND SYNDROME[6] |
| DATA[38] | NOT SYNDROME[8] AND NOT SYNDROME[3] AND NOT SYNDROME[1] AND SYNDROME[2] AND SYNDROME[7] |
| DATA[37] | NOT SYNDROME[7] AND NOT SYNDROME[3] AND NOT SYNDROME[1] AND SYNDROME[8] |
| DATA[36] | NOT SYNDROME[6] AND NOT SYNDROME[3] AND NOT SYNDROME[1] AND SYNDROME[0] AND SYNDROME[5] AND SYNDROME[8] |
| DATA[35] | NOT SYNDROME[5] AND NOT SYNDROME[3] AND NOT SYNDROME[1] AND SYNDROME[0] AND SYNDROME[2] AND SYNDROME[6] |
| DATA[34] | NOT SYNDROME[4] AND NOT SYNDROME[3] AND NOT SYNDROME[1] AND SYNDROME[0] AND SYNDROME[5] |
| DATA[33] | NOT SYNDROME[8] AND NOT SYNDROME[2] AND NOT SYNDROME[1] AND SYNDROME[0] AND SYNDROME[3] AND SYNDROME[7] |
| DATA[32] | NOT SYNDROME[7] AND NOT SYNDROME[2] AND NOT SYNDROME[1] AND SYNDROME[8] |
| DATA[31] | NOT SYNDROME[6] AND NOT SYNDROME[2] AND NOT SYNDROME[1] AND SYNDROME[5] AND SYNDROME[8] |
| DATA[30] | NOT SYNDROME[5] AND NOT SYNDROME[2] AND NOT SYNDROME[1] AND SYNDROME[3] AND SYNDROME[4] AND SYNDROME[7] |
| DATA[29] | NOT SYNDROME[4] AND NOT SYNDROME[2] AND NOT SYNDROME[1] AND SYNDROME[0] AND SYNDROME[5] |
| DATA[28] | NOT SYNDROME[3] AND NOT SYNDROME[2] AND NOT SYNDROME[1] AND SYNDROME[0] AND SYNDROME[5] AND SYNDROME[8] |
| DATA[27] | NOT SYNDROME[8] AND NOT SYNDROME[7] AND NOT SYNDROME[0] AND SYNDROME[1] AND SYNDROME[2] AND SYNDROME[6] |
| DATA[26] | NOT SYNDROME[8] AND NOT SYNDROME[6] AND |

Error Location Signal ERR_LOC Generation for the Signal DATA

| DATA | ERR_LOC |
|---|---|
| | NOT SYNDROME[0] AND SYNDROME[7] |
| DATA[25] | NOT SYNDROME[7] AND NOT SYNDROME[6] AND NOT SYNDROME[0] AND SYNDROME[5] AND SYNDROME[8] |
| DATA[24] | NOT SYNDROME[8] AND NOT SYNDROME[5] AND NOT SYNDROME[0] AND SYNDROME[7] |
| DATA[23] | NOT SYNDROME[7] AND NOT SYNDROME[5] AND NOT SYNDROME[0] AND SYNDROME[4] AND SYNDROME[8] |
| DATA[22] | NOT SYNDROME[6] AND NOT SYNDROME[5] AND NOT SYNDROME[0] AND SYNDROME[2] AND SYNDROME[3] AND SYNDROME[7] |
| DATA[21] | NOT SYNDROME[8] AND NOT SYNDROME[4] AND NOT SYNDROME[0] AND SYNDROME[2] AND SYNDROME[7] |
| DATA[20] | NOT SYNDROME[7] AND NOT SYNDROME[4] AND NOT SYNDROME[0] AND SYNDROME[5] AND SYNDROME[8] |
| DATA[19] | NOT SYNDROME[6] AND NOT SYNDROME[4] AND NOT SYNDROME[0] AND SYNDROME[2] AND SYNDROME[3] AND SYNDROME[7] |
| DATA[18] | NOT SYNDROME[5] AND NOT SYNDROME[4] AND NOT SYNDROME[0] AND SYNDROME[2] AND SYNDROME[3] AND SYNDROME[6] |
| DATA[17] | NOT SYNDROME[8] AND NOT SYNDROME[3] AND NOT SYNDROME[0] AND SYNDROME[2] AND SYNDROME[7] |
| DATA[16] | NOT SYNDROME[7] AND NOT SYNDROME[3] AND NOT SYNDROME[0] AND SYNDROME[4] AND SYNDROME[8] |
| DATA[15] | NOT SYNDROME[6] AND NOT SYNDROME[3] AND NOT SYNDROME[0] AND SYNDROME[1] AND SYNDROME[5] AND SYNDROME[7] |
| DATA[14] | NOT SYNDROME[5] AND NOT SYNDROME[3] AND NOT SYNDROME[0] AND SYNDROME[1] AND SYNDROME[4] |
| DATA[13] | NOT SYNDROME[4] AND NOT SYNDROME[3] AND NOT SYNDROME[0] AND SYNDROME[1] AND SYNDROME[5] |
| DATA[12] | NOT SYNDROME[8] AND NOT SYNDROME[2] AND NOT SYNDROME[0] AND SYNDROME[1] AND SYNDROME[7] |
| DATA[11] | NOT SYNDROME[7] AND NOT SYNDROME[2] AND NOT SYNDROME[0] AND SYNDROME[8] |
| DATA[10] | NOT SYNDROME[6] AND NOT SYNDROME[2] AND NOT SYNDROME[0] AND SYNDROME[4] AND SYNDROME[8] |
| DATA[9] | NOT SYNDROME[5] AND NOT SYNDROME[2] AND NOT SYNDROME[0] AND SYNDROME[1] AND SYNDROME[4] AND SYNDROME[8] |
| DATA[8] | NOT SYNDROME[4] AND NOT SYNDROME[2] AND NOT SYNDROME[0] AND SYNDROME[1] AND SYNDROME[5] AND SYNDROME[8] |
| DATA[7] | NOT SYNDROME[3] AND NOT SYNDROME[2] AND NOT SYNDROME[0] AND SYNDROME[1] AND SYNDROME[5] AND SYNDROME[7] |
| DATA[6] | NOT SYNDROME[8] AND NOT SYNDROME[1] AND NOT SYNDROME[0] AND SYNDROME[2] AND SYNDROME[7] |
| DATA[5] | NOT SYNDROME[7] AND NOT SYNDROME[1] AND NOT SYNDROME[0] AND SYNDROME[8] |
| DATA[4] | NOT SYNDROME[6] AND NOT SYNDROME[1] AND NOT SYNDROME[0] AND SYNDROME[3] AND SYNDROME[7] |
| DATA[3] | NOT SYNDROME[5] AND NOT SYNDROME[1] AND NOT SYNDROME[0] AND SYNDROME[3] AND SYNDROME[4] AND SYNDROME[7] |
| DATA[2] | NOT SYNDROME[4] AND NOT SYNDROME[1] AND NOT SYNDROME[0] AND SYNDROME[2] AND SYNDROME[3] AND SYNDROME[8] |
| DATA[1] | NOT SYNDROME[3] AND NOT SYNDROME[1] AND NOT SYNDROME[0] AND SYNDROME[4] AND SYNDROME[5] AND SYNDROME[8] |
| DATA[0] | NOT SYNDROME[2] AND NOT SYNDROME[1] AND NOT SYNDROME[0] AND SYNDROME[3] AND SYNDROME[4] |

Error Location Signal ERR_LOC Generation for the Signal PARITY

| PARITY | ERR_LOC |
|---|---|
| PARITY[0] | NOT SYNDROME[0] AND SYNDROME[2] AND SYNDROME[3] AND SYNDROME[4] AND SYNDROME[5] AND SYNDROME[6] AND SYNDROME[7] AND SYNDROME[8] |
| PARITY[1] | NOT SYNDROME[1] AND SYNDROME[0] AND SYNDROME[2] AND SYNDROME[3] AND SYNDROME[4] AND SYNDROME[5] AND SYNDROME[7] AND SYNDROME[8] |
| PARITY[2] | NOT SYNDROME[2] AND SYNDROME[1] AND SYNDROME[3] AND SYNDROME[4] AND SYNDROME[5] AND SYNDROME[6] AND SYNDROME[7] AND SYNDROME[8] |
| PARITY[3] | NOT SYNDROME[3] AND SYNDROME[0] AND SYNDROME[1] AND SYNDROME[2] AND SYNDROME[4] AND SYNDROME[5] AND SYNDROME[6] AND SYNDROME[8] |
| PARITY[4] | NOT SYNDROME[4] AND SYNDROME[0] AND SYNDROME[1] AND SYNDROME[2] AND SYNDROME[5] AND SYNDROME[6] AND SYNDROME[7] AND SYNDROME[8] |
| PARITY[5] | NOT SYNDROME[5] AND SYNDROME[0] AND SYNDROME[1] AND SYNDROME[2] AND SYNDROME[3] AND SYNDROME[6] AND SYNDROME[7] AND SYNDROME[8] |
| PARITY[6] | NOT SYNDROME[6] AND SYNDROME[0] AND SYNDROME[1] AND SYNDROME[2] AND SYNDROME[3] AND SYNDROME[4] AND SYNDROME[5] AND SYNDROME[7] |
| PARITY[7] | NOT SYNDROME[7] AND SYNDROME[0] AND SYNDROME[1] AND SYNDROME[2] AND SYNDROME[3] AND SYNDROME[4] AND SYNDROME[6] AND SYNDROME[8] |
| PARITY[8] | NOT SYNDROME[8] AND SYNDROME[0] AND SYNDROME[1] AND SYNDROME[3] AND SYNDROME[4] AND SYNDROME[5] AND SYNDROME[6] AND SYNDROME[7] |

However, other logic and/or coding for generation of the signal ERR_LOC may be implemented accordingly to meet the design criteria of a particular application.

In one example, the circuit 182 may be configured to generate the signal ERR_LOC in response to non-inverted syndrome values in the signal SYNDROME. In another example, the circuit 182 may be configured to generate the signal ERR_LOC in response to inverted syndrome values in the signal SYNDROME. For example, in the case where the circuit 182 is configured to receive inverted syndrome values for the signal SYNDROME, the bit of the signal ERR_LOC corresponding to the data bit DATA[0] may equal (NOT SYNDROME[1]) AND (NOT SYNDROME[2]) AND (NOT SYNDROME[3]) AND SYNDROME[4] AND SYNDROME[5]. The bits of the signal ERR_LOC corresponding to the data bits DATA[1:127] and the bits of the signal PARITY may be generated similarly.

Figure 6:
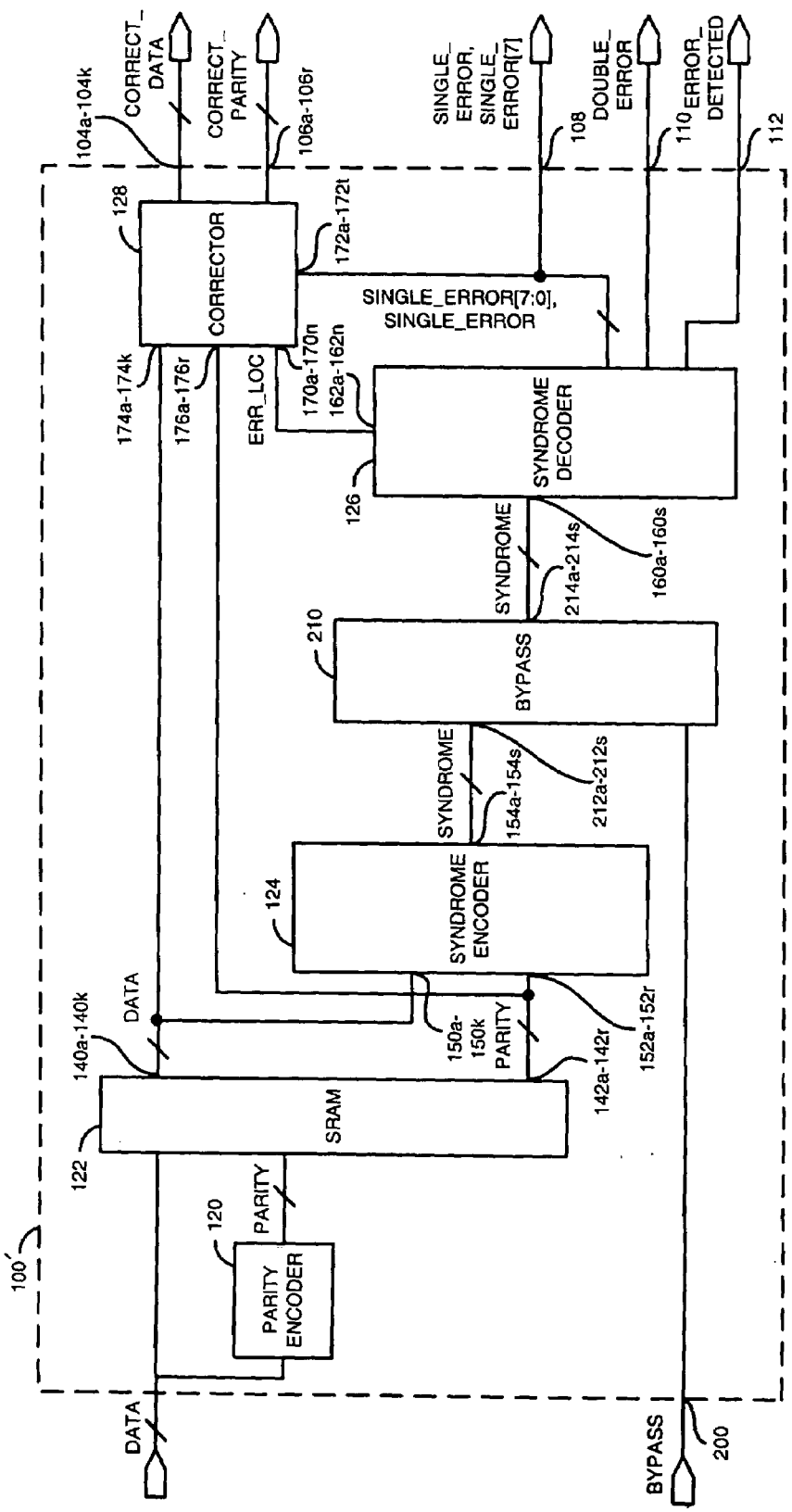
FIG. 6 is a block diagram of an alternative embodiment of the error control coding memory circuit of the present invention.

Referring to FIG. 6, a block diagram of a circuit 100' illustrating an alternative embodiment of the present invention is shown. The circuit 100' may be implemented similarly to the circuit 100. The circuit 100' may have an input 200 that may receive a signal (e.g., BYPASS). The signal BYPASS may be a control signal. The circuit 100' may be configured to enable the signals DATA and PARITY to bypass the circuit 126 in response to the signal BYPASS.

The circuit 100' may comprise a circuit 210. The circuit 210 may have an input that may receive the signal BYPASS, one or more inputs 212a–212s that may receive the signal SYNDROME from the outputs 154a–154s of the circuit 124, and one or more outputs 214a–214s that may present the signal SYNDROME to the inputs 160a–160s of the circuit 126.

When the signal SYNDROME indicates that no errors have been detected in the read operation of the circuit 122 (e.g., all of the bits of the signal SYNDROME comprise digital 1 in the case of an inverted syndrome), the signals CORRECT_DATA and CORRECT_PARITY are generally the same as the signals DATA and PARITY, respectively. Correction of the signals DATA and PARITY read from the circuit 122 may not be required. The circuit 128 may present the signals DATA and PARITY as read from the circuit 122 as the signals CORRECT_DATA and CORRECT_PARITY, respectively, in response to the signal BYPASS. The signal BYPASS may be implemented in accordance with FIG. 7 and TABLES 3 and 4 (described below) to meet the design criteria of a particular application.

When the signal SYNDROME indicates that one or more errors have been detected in the read operation of the circuit 122 (e.g., the bits of signal SYNDROME are not all equal to digital 1 in the case of an inverted syndrome), the signal BYPASS may be de-asserted. The circuit 210 may present the signal SYNDROME to the circuit 126. The circuit 100' may operate similarly to the circuit 100.

Figure 7:
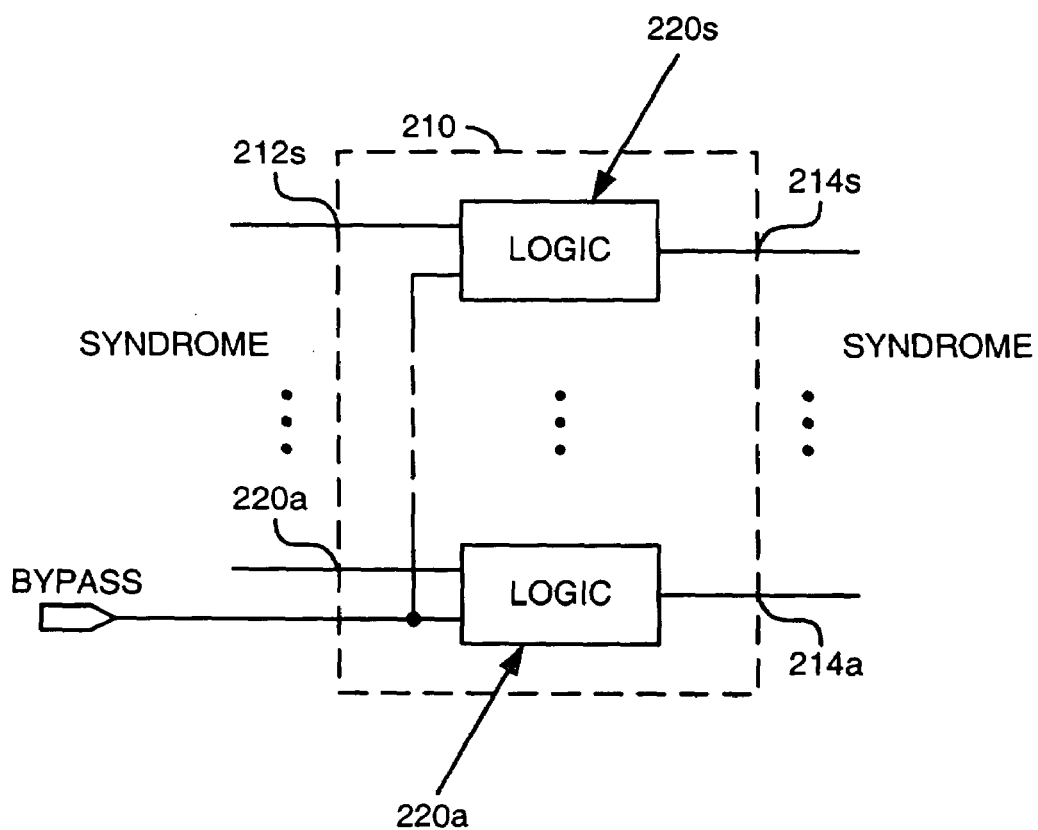
FIG. 7 is a block diagram of a bypass circuit of FIG. 6.

Referring to FIG. 7, a block diagram of the circuit 210 is shown. The circuit 210 may comprise one or more devices 220a–220s, where s is an integer. The devices 220 may be implemented as logic gates. The devices 220 may be implemented as OR, AND, NOR, NAND gates, etc. The number of devices 220 is generally equal to the number of bits in the signal SYNDROME. Each of the devices 220a–220s may have an input that may receive a respective bit of the signal SYNDROME (e.g., SYNDROME[0]-SYNDROME[8]), an input that may receive the signal BYPASS, and an output that may present a respective bit of the signal SYNDROME.

When the signal BYPASS is asserted, the error correcting logic of the circuit 100 may be disabled by the circuit 210 presenting the signal SYNDROME in the "no errors" condition. In response, the circuit 128 may present the signals DATA and PARITY as the signals CORRECT_DATA and CORRECT_PARITY, respectively.

The devices 220 and the appropriate logic state (e.g., "on", a digital HIGH, or 1 or "off", a digital LOW, or 0) of the signal BYPASS to control the circuit 100 such that the circuit 126 is bypassed when no errors are detected in the signals DATA and PARITY as read from the circuit 122 may be implemented as shown in TABLE 3 below. However, the appropriate polarity of the signal BYPASS may be inverted by the implementation of a NOT gate (e.g., an inverter) at the signal BYPASS input of the circuit 210.

TABLE 3 may summarize types of logic gates 220 and the logic state of the signal BYPASS that may be implemented accordingly to meet the design criteria of a particular application. When the devices 220 are implemented as OR and NAND logic gates, the signal SYNDROME is generally implemented having inverted syndrome values. When the devices 220 are implemented as AND and NOR logic gates, the signal SYNDROME is generally implemented having non-inverted syndrome values.

TABLE 3

| Syndrome Encoder 124 Output from TABLE 2 | Syndrome Decoder 126 Input Expected | Gates 220 to Use | Input to Bypass-pin to bypass Correction 128 |
|---|---|---|---|
| Non-Inverted Syndrome | Non-Inverted Syndrome | AND | Logic 0 |
| Non-Inverted Syndrome | Inverted Syndrome | NAND | Logic 0 |
| Inverted Syndrome | Non-Inverted Syndrome | NOR | Logic 1 |
| Inverted Syndrome | Inverted Syndrome | OR | Logic 1 |

In one example, when the signal SYNDROME presented by the circuit 124 is inverted and the circuit 126 is configured to receive an inverted syndrome, the circuit 210 may be implemented using one or more OR logic gates 220. When the signal BYPASS is a digital 1, the OR gates 220 may each present a digital 1 for each bit of the signal SYNDROME.

TABLE 4 may summarize the operation of the circuit 210 for each bit of the signal SYNDROME. In the TABLE 4, "Non-Inverting" generally indicates that a given bit of the signal SYNDROME passes through the OR or AND gates 220 non-inverted when the BYPASS signal is inactive. Similarly, "Inverting" generally indicates that a given bit of the signal SYNDROME is inverted when passed through the NOR or NAND gates 220 when the signal BYPASS is inactive.

TABLE 4

| BY-PASS | SYNDROME Bit | Output of OR 220 | Output of AND 220 | Output of NOR 220 | Output of NAND 220 |
|---|---|---|---|---|---|
| 0 | 0 | 0 | 0 | 1 | 1 |
| 0 | 1 | 1 | 0 | 0 | 1 |
| 1 | 0 | 1 | 0 | 0 | 1 |
| 1 | 1 | 1 | 1 | 0 | 0 |
|   |   | Non-Inverting |   | Inverting |   |

TABLE 5 may summarize alternative implementations of the circuit 100'.

TABLE 5

| Syndrome Encoder 124 Type | SYNDROME before Bypass | with AND Bypass 220 | with OR Bypass 220 | with NOR Bypass 220 | with NAND Bypass 220 |
|---|---|---|---|---|---|
| Inverting XNOR | Inverted | NA | 2.25 ns 6405.00 lu 847 cells | 2.47 ns 6442.00 lu 850 cells | NA |
| Inverting XNOR with | Non-Inverted | 2.46 ns 6419.00 lu | NA | NA | 2.37 ns 6375.00 lu |

TABLE 5-continued

| Syndrome Encoder 124 Type | SYNDROME before Bypass | with AND Bypass 220 | with OR Bypass 220 | with NOR Bypass 220 | with NAND Bypass 220 |
|---|---|---|---|---|---|
| NOT | | 855 cells | | | 846 cells |
| Non-Inverting XNOR with NOT | Inverted | NA | 2.74 ns 6421.00 lu 858 cells | 2.48 ns 6459.00 lu 863 cells | NA |
| Non-Inverting XNOR | Non-Inverted | 2.47 ns 6436.00 lu 868 cells | NA | NA | 2.73 ns 6391.00 lu 857 cells |
| XOR | Non-Inverted | 2.79 ns 6545.00 lu 777 cells | NA | NA | 2.83 ns 6391.00 lu 857 cells |
| XOR with NOT | Inverted | NA | 2.78 ns 6527.00 lu 780 cells | 2.90 ns 6553.00 lu 774 cells | NA |
| Inverting XOR | Inverted | NA | 2.78 ns 6527.00 lu 780 cells | 2.90 ns 6553.00 lu 774 cells | NA |
| Inverting XOR with NOT | Non-Inverted | 2.74 ns 6535.00 lu 776 cells | NA | NA | 2.77 ns 6490.00 lu 779 cells |

When the circuit 124 is implemented as an inverting XNOR syndrome encoder, the 100' circuit may have the fastest read cycle (e.g. 2.25 ns).

VHDL coding (not shown) may be implemented to provide a representation of the components of the circuit 100 (e.g., the parity encoder 120, the syndrome encoder 124, the error corrector 128, the error locator 182, etc.) and the top level binding circuitry and/or coding. However, any appropriate representation may be implemented accordingly to meet the design criteria of a particular application.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

The invention claimed is:

1. An apparatus for memory error control coding comprising:
a syndrome encoder circuit configured to (i) receive a read data signal and a read parity signal and (ii) generate a first syndrome signal in response to said read data signal and said read parity signal;
a bypass circuit configured to (i) receive said first syndrome signal and a bypass signal and (ii) generate a second syndrome signal in response to said first syndrome signal and said bypass signal, wherein said bypass circuit comprises one or more logic gates configured to (i) receive said first syndrome signal at a first input, (ii) receive said bypass signal at a second input and (iii) present said second syndrome signal at an output;
a detector circuit configured to (i) receive said second syndrome signal, (ii) detect an error when bits of said second syndrome signal are not all the same state and (iii) generate one or more single error signals when a single bit error is detected in said read data and said read parity signals, a double error signal when an error is detected in two bits of said read data and read parity signals, and an error detected signal when either one of said one or more single error signals or said double error signal are asserted in response to said second syndrome signal;
a locator circuit configured to (i) receive said second syndrome signal and (ii) generate an error location signal in response to said second syndrome signal, wherein said error location signal (i) is generated in response to fewer than all of said bits of said second syndrome signal and (ii) describes a location of a single bit error detected in said read data and said read parity signals; and
a corrector circuit configured to (i) receive said read data signal, said read parity signal, said error location signal and said one or more single error signals and (ii) generate a corrected representation of said read data and said read parity signals in response to said error location signal when a single bit error is detected.

2. The apparatus according to claim 1, wherein all bits of said first syndrome signal are at a particular state when no error is detected in said read data and said read parity signals and said particular state comprises a digital 1.

3. The apparatus according to claim 1, wherein said apparatus is configured to present said read data and parity signals at an output when no error is detected in said read data and said read parity signals.

4. The apparatus according to claim 1, further comprising a memory circuit configured to (i) receive a data input signal and a parity input signal during a write operation and (ii) present said read data and said read parity signals during a read operation.

5. The apparatus according to claim 1, said corrector circuit is further configured to present said read data and said read parity signals as said corrected representation of said read data and said read parity signals when no error is detected by said detector circuit.

6. The apparatus according to claim 1, wherein said locator circuit and said detector circuit are configured to invert each of said bits of said second syndrome signal.

7. The apparatus according to claim 1, further comprising:
an encoder circuit configured to generate a parity signal in response to a data input signal, wherein said encoder circuit comprises a type selected from the group consisting of (i) non-inverting exclusive-OR gates, (ii) non-inverting exclusive-OR gates with an output inverted by a NOT gate, (iii) inverting exclusive-OR gates, (iv) inverting exclusive-OR gates with an output inverted by a NOT gate, (v) non-inverting exclusive-NOR gates, (vi) inverting exclusive-NOR gates, (vii) non-inverting exclusive-NOR gates with an output inverted by a NOT gate, and (viii) inverting exclusive-NOR gates with an output inverted by a NOT gate.

8. The apparatus according to claim 1, wherein said detector circuit comprises:
   one or more OR gates configured to receive an inverse of said second syndrome signal and present said error detected signal;
   one or more exclusive-OR gates configured to receive an inverse of said second syndrome signal and present an intermediate signal;
   one or more AND gates configured to present said one or more single error signals in response to said error detected signal and said intermediate signal; and
   an AND gate configured to present said double error signal in response to said error detected signal and an inverse of said intermediate signal.

9. The apparatus according to claim 8, wherein said one or more single error signals comprise a multi-bit digital signal.

10. The apparatus according to claim 1, wherein said first syndrome signal is generated using a type of syndrome encoder selected from the group consisting of (i) non-inverting exclusive-OR gates, (ii) non-inverting exclusive-OR gates with an output inverted by a NOT gate, (iii) inverting exclusive-OR gates, (iv) inverting exclusive-OR gates with an output inverted by a NOT gate, (v) non-inverting exclusive-NOR gates, (vi) non-inverting exclusive-NOR gates with an output inverted by a NOT gate, (vii) inverting exclusive-NOR gates, and (viii) inverting exclusive-NOR gates with an output inverted by a NOT gate.

11. The apparatus according to claim 1, wherein said one or more logic gates of said bypass circuit are configured to (i) present each of said bits of said second syndrome signal having a state determined by a corresponding bit of said first syndrome signal in response to said bypass signal having a first state and (ii) present all of said bits of said second syndrome signal having the same state in response to said bypass signal having a second state.

12. The apparatus according to claim 11, wherein said one or more logic gates are selected from the group consisting of AND, NAND, NOR, and OR gates.

13. The apparatus according to claim 11, wherein said bypass circuit is configured to present ail of said bits of said second syndrome signal as a digital 1 in response to said bypass signal having said second state.

14. An apparatus for memory error control coding comprising:
   means for generating a first syndrome signal in response to a read data signal and a read parity signal;
   means for generating a second syndrome signal in response to said first syndrome signal and a bypass signal, wherein (i) each bit of said second syndrome signal has a state determined by a corresponding bit of said first syndrome signal when said bypass signal is in a first state and (ii) all bits of said second syndrome signal have the same state when said bypass signal is in a second state;
   means for (i) detecting an error when bits of said second syndrome signal are not all the same state and (ii) generating an error location signal, an error detected signal, a double error signal and one or more single error signals in response to said second syndrome signal, wherein said error location signal (i) is generated in response to fewer than all of said bits of said second syndrome signal and (ii) describes a location of a single bit error detected in said read data and said read parity signals; and
   means for generating a corrected representation of said read data and said read parity signals in response to said error location signal when a single bit error is detected.

15. A method for memory error detection and correction comprising the steps of:
   (A) generating a first syndrome signal in response to a read data signal and a read parity signal;
   (B) generating a second syndrome signal in response to said first syndrome signal and a bypass signal, wherein (i) each bit of said second syndrome signal has a state determined by a corresponding bit of said first syndrome signal when said bypass signal is in a first state and (ii) all bits of said second syndrome signal have the same state when said bypass signal is in a second state;
   (C) detecting an error when bits of said second syndrome signal are not all the same state; and
   (D) generating an error location signal, an error detected signal, a double error signal and one or more single error signals in response to said second syndrome signal, wherein said error location signal (i) is generated in response to fewer than all of said bits of said second syndrome signal and (ii) describes a location of a single bit error detected in said read data and said read parity signals.

16. The method according to claim 15, wherein all of said bits of said second syndrome signal are at a particular state when no error is detected in said read data and said read parity signals and said particular state comprises a digital 1.

17. The method according to claim 15, further comprising the step of:
   bypassing said error location signal generating step in response to a predetermined state of said bypass signal.

18. The method according to claim 15, wherein step (C) further comprises the sub-steps of:
   generating said one or more single error signals when a single bit error is detected in said read data signal or said read parity signal;
   generating said double error signal when an error is detected in two bits of said read data and said read parity signals; and
   generating said error detected signal when either one of said one or more single error signals or said double error signal are generated in response to said second syndrome signal.

19. The method according to claim 15, further comprising the step of:
   presenting said read data and said read parity signals when no error is detected in said read data and parity signals.

20. The method according to claim 15, further comprising the step of:
   generating a corrected representation of said read data and said read parity signals in response to said error location signal when said single bit error is detected.

* * * * *